United States Patent
Chuang et al.

(10) Patent No.: US 7,035,001 B2
(45) Date of Patent: *Apr. 25, 2006

(54) HIGH NA SYSTEM FOR MULTIPLE MODE IMAGING

(75) Inventors: Yung-Ho Chuang, Cupertino, CA (US); David Shafer, Fairfield, CT (US); Bin-Ming B. Tsai, Saratoga, CA (US); J. Joseph Armstrong, Milpitas, CA (US)

(73) Assignee: KLA-Tencor Corporation, San Jose, CA (US)

( * ) Notice: Subject to any disclaimer, the term of this patent is extended or adjusted under 35 U.S.C. 154(b) by 401 days.

This patent is subject to a terminal disclaimer.

(21) Appl. No.: 10/429,613

(22) Filed: May 5, 2003

(65) Prior Publication Data

US 2003/0197923 A1    Oct. 23, 2003

Related U.S. Application Data

(63) Continuation of application No. 10/151,509, filed on May 20, 2002, now Pat. No. 6,560,011, which is a continuation of application No. 09/477,184, filed on Jan. 4, 2000, now Pat. No. 6,392,793, which is a continuation of application No. 09/046,814, filed on Mar. 24, 1998, now Pat. No. 6,064,517, which is a continuation-in-part of application No. 08/908,247, filed on Aug. 7, 1997, now Pat. No. 5,999,310, which is a continuation-in-part of application No. 08/681,528, filed on Jul. 22, 1996, now Pat. No. 5,717,518.

(51) Int. Cl.
*G02B 23/00* (2006.01)
*G02B 17/00* (2006.01)

(52) U.S. Cl. ........................ 359/364; 359/357; 359/726

(58) Field of Classification Search ........ 359/362–367, 359/368, 385–387, 725–732, 350–361
See application file for complete search history.

(56) References Cited

U.S. PATENT DOCUMENTS 1,973,066 A    9/1934    Hauser et al. .............. 359/390

(Continued)

FOREIGN PATENT DOCUMENTS

DE    3742806    7/1989

(Continued)

OTHER PUBLICATIONS

M.R. Bartz et al., "LED Print Analyzer," IBM Technical Disclosure Bulletin, vol. 14, No. 3, Aug. 1971.

(Continued)

*Primary Examiner*—Thong Q Nguyen
(74) *Attorney, Agent, or Firm*—Smyrski Law Group APC

(57) ABSTRACT

A system for multiple mode imaging is disclosed. The catadioptric system has an NA greater than 0.65, and preferably greater than 0.9, highly corrected for low and high order monochromatic aberrations. The system employs unique illumination entrances and optics to collect reflected, diffracted, and scattered light over a range of angles. Multiple imaging modes are possible by varying the illumination geometry and apertures at the pupil plane. Illumination can enter the catadioptric optical sytems using an auxiliary beamsplitter or mirror, or through the catadioptric elements at any angle from 0 to 85 degrees from vertical. The system may employ a relayed pupil plane, used to select different imaging modes, provide simultaneous operation of different imaging modes, Fourier filtering, and other pupil shaping operations.

20 Claims, 21 Drawing Sheets

U.S. PATENT DOCUMENTS

| | | | | |
|---|---|---|---|---|
| 2,661,658 A | * | 12/1953 | Dyson | 359/727 |
| 4,758,088 A | | 7/1988 | Doyle | 359/385 |
| 4,898,471 A | | 2/1990 | Vaught et al. | 356/346 |
| 4,974,094 A | | 11/1990 | Morito | 359/385 |
| 5,031,976 A | * | 7/1991 | Shafer | 359/355 |
| 5,177,559 A | | 1/1993 | Batchelder et al. | 356/237.5 |
| 5,428,442 A | | 6/1995 | Lin et al. | 356/237.5 |
| 5,488,229 A | | 1/1996 | Elliott et al. | 250/492.2 |
| 5,644,140 A | | 7/1997 | Biedermann et al. | 250/559.08 |
| 5,717,518 A | | 2/1998 | Shafer et al. | 359/357 |
| 6,064,517 A | * | 5/2000 | Chuang et al. | 359/364 |
| 6,392,793 B1 | | 5/2002 | Chuang et al. | 359/364 |

FOREIGN PATENT DOCUMENTS

WO 9712226 4/1997

OTHER PUBLICATIONS

D.S. Goodman, "Darkfield Illuminator Attachment," IBM Technical Disclosure Bulletin, vol. 27, No. 5, Oct. 1984.

J.L.C. Sanz et al., "Automated Visual Inspection with Dark-Field Microscopy," Journal of the Optical Society of America, Nov. 1985, USA, vol. 2, No. 11, pp. 1857-1862.

* cited by examiner

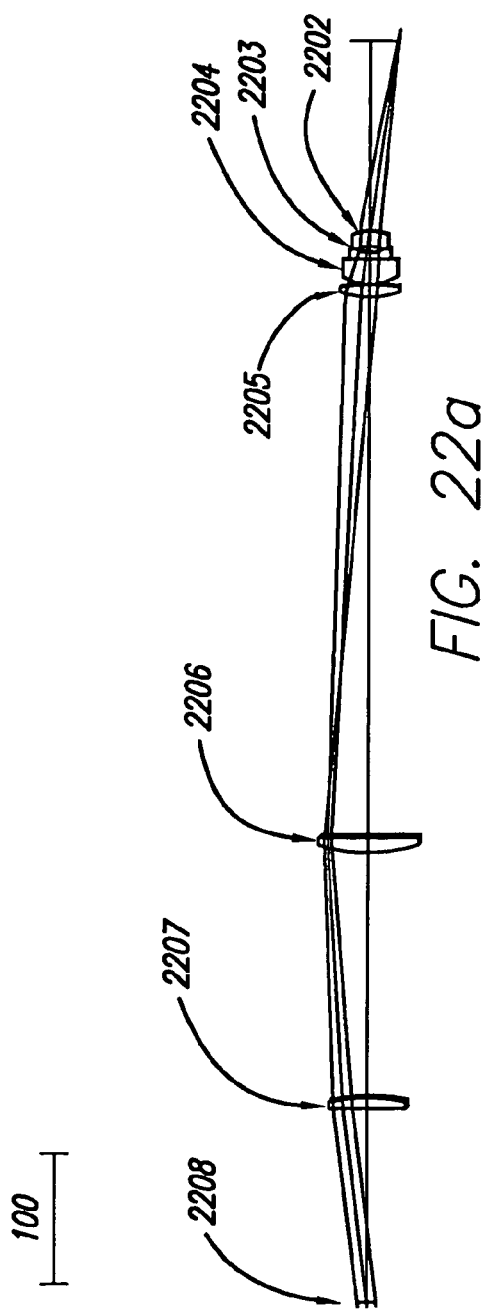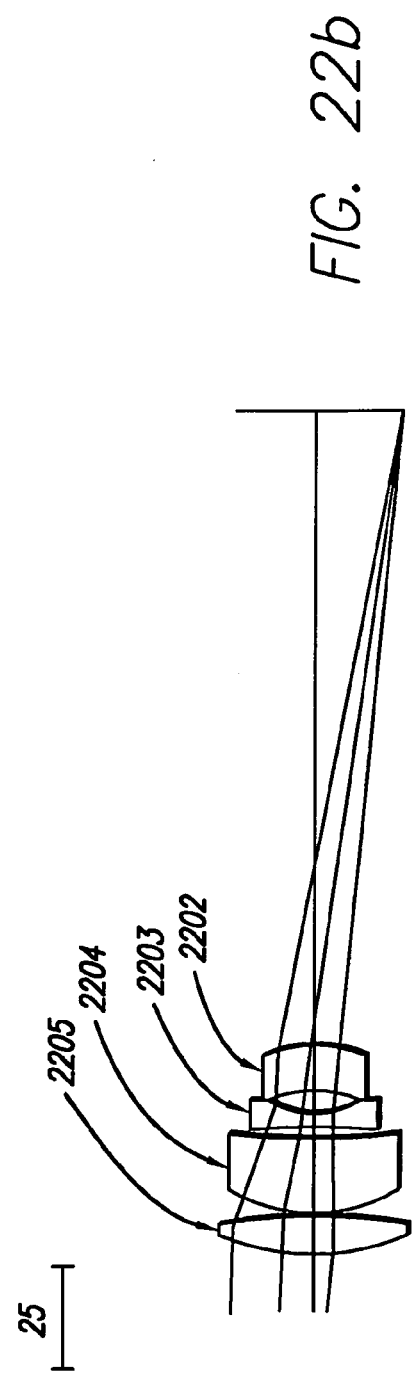
FIG. 22a
FIG. 22b

HIGH NA SYSTEM FOR MULTIPLE MODE IMAGING

This application is a continuation of U.S. patent application Ser. No. 10/151,509, filed May 20, 2002, now U.S. Pat. No. 6,560,011 which is a continuation of U.S. patent application Ser. No. 09/477,184, filed Jan. 4, 2000, now U.S. Pat. No. 6,392,793, which is a continuation of U.S. patent application Ser. No. 09/046,814, filed Mar. 24, 1998, now U.S. Pat. No. 6,064,517, which is a continuation in part of U.S. patent application Ser. No. 08/908,247, entitled "Ultra-Broadband UV Microscope Imaging System with Wide Range Capability" filed on Aug. 7, 1997, now U.S. Pat. No. 5,999,310 which is a continuation in part of United States patent application Ser. No. 08/681,528, entitled "Broad Spectrum Ultraviolet Catadioptnc Imaging System," filed on Jul. 22, 1996, now U.S. Pat. No. 5,717,518, all of which are hereby incorporated by reference.

BACKGROUND OF THE INVENTION

1. Field of the Invention

The present invention relates generally to a method and apparatus for multiple mode imaging, and more particularly to catadioptric optical systems used for dark field imaging applications.

2. Description of the Related Art

High precision optical instruments and imaging systems used in many different applications must operate effectively and efficiently. To accommodate optical functionality under varied conditions, precision lenses are often employed in different complex combinations.

Many different imaging modes exist for optical inspection. These imaging modes include bright field, confocal, and a variety of dark field imaging modes. Typically each different mode requires a different machine. Full inspection of an object, such as a semiconductor wafer, requires several separate very expensive machines. Combining many different imaging modes into one machine can dramatically reduce inspection costs as well as provide performance advantages.

The bright field imaging mode is commonly used in microscope systems. The advantage of bright field imaging is the image produced is readily distinguishable. The size of image features accurately represents the size of object features multiplied by the magnification of the optical system. This technique can be more easily used with image comparison and processing algorithms for computerized object detection and classification.

The confocal imaging mode has been successfully used for optical sectioning to resolve the height differences of object features. Most imaging modes have difficulty detecting changes in the height of features. The confocal mode forms separate images of object features at each height of interest. Comparison of the images then shows the relative heights of different features.

The dark field imaging mode has been successfully used to detect features on objects. The advantage of dark field imaging is that flat specular areas scatter very little light toward the detector, resulting in a dark image. Any surface features or objects protruding above the object scatter light toward the detector. Thus, in inspecting objects like semiconductor wafers, dark field imaging produces an image of features, particles, or other irregularities on a dark background.

Dark field illumination provides a large signal for small features that scatter light. This large signal allows larger pixels to be used for a given feature size, permitting faster object inspections. Fourier filtering can also be used to minimize the repeating pattern signal and enhance the defect signal to noise ratio.

Each dark field mode consists of a specific illumination scheme and collection scheme such that the scattered and diffracted light collected from the object provides the best signal. Several optical systems have been developed that use different dark field imaging modes including laser directional dark field, double dark field, and central dark ground.

One prior method for achieving laser directional dark field imaging is disclosed in U.S. Pat. No. 5,177,559, issued Jan. 5, 1993 to Batchelder and Taubenblatt and assigned to International Business Machines, which is hereby incorporated by reference. This method uses a collimated beam of monochromatic light to illuminate a semiconductor wafer from outside the objective between an angle of 8 degrees from the horizontal and the numerical aperture, or NA, defined by the imaging objective. Before forming a dark field image, the collected light passes through a Fourier filter to attenuate the spatial frequency components corresponding to repeating array patterns.

This laser directional dark field method illuminates the wafer outside the NA of the imaging objective. For this reason, the illumination angles are limited to between 8 degrees from the horizontal and the NA defined by the imaging objective. Collection angles are also limited to the range of angles within the NA of the objective. A long working distance objective is necessary to allow access by the laser to the area of interest on the semiconductor wafer. Objectives used in dark field applications of this type are generally limited to NAs less than 0.7, which corresponds to collection angles of only up to 44 degrees from normal.

Another prior method for achieving laser directional dark field imaging is disclosed in U.S. Pat. No. 5,428,442, issued Jun. 27, 1995 to Lin and Scheff and assigned Optical Specialties, which is hereby incorporated by reference. This method uses a collimated beam of monochromatic light illuminating the wafer from inside the optical system, within the NA defined by the objective. If the system will encounter a specific range of defect sizes, the illumination angle on the wafer is chosen so the optical system collects spatial frequencies of interest.

This is a laser directional dark field method wherein the laser illuminates the wafer from inside the NA as defined by the objective. The system uses the same objective pupil plane for injecting the illumination and processing the light collected by the objective. This objective pupil feature seriously limits the types of illumination and Fourier filtering that are possible. Systems using objectives of this type are generally limited to NAs of less than approximately 0.9. This means illumination angles are limited to less than approximately 64 degrees. Illumination at angles above 64 degrees is often necessary to obtain optimum defect sensitivity. This high angle illumination is not possible without a higher NA objective. The available objectives of this type with a high NA have very small fields, relative to that of a lower NA objective. This seriously limits the number of resolvable points in the image and the achievable inspection speed. Another problem with this technique is small amounts of scattered and reflected light from lens elements in this system have the ability to produce noise at levels that compromise the sensitivity. Introducing laser illumination from inside this type of objective can cause a significant amount of scattered and reflected light from the multiple lens surfaces. The system must deal with scattered light from the lenses, illumination beam and the specular reflection from the wafer, which is a tremendous potential problem.

A third known dark field imaging method designed to detect particles on a periodic patterned object is disclosed in U.S. Pat. No. 4,898,471, issued Feb. 6, 1990 to Stonestrom et al. and assigned to Tencor Instruments, which is hereby incorporated by reference. This method uses a single light beam scanned at a shallow angle over the object. The position of the collection system as well as the polarization of the light beam may be arranged to maximize the particle signal compared to the patterned signal.

This single beam/shallow angle system uses an off axis collector to image the area of interest onto a detector. The position of the collection system as well as the polarization of the illumination is arranged to maximize the signal scattered by particles. Only a single angular position is used for illumination and another angular position for collection. Such a dark field system uses a single spot to scan across the wafer in conjunction with a single detector. If the system uses a small spot for high sensitivity detection, the inspection speed tends to decrease dramatically. If a larger spot size is used to increase inspection speed, the overall system sensitivity degrades.

In the practical industrial application for object inspection the scattered and diffracted light is collected from either side of the plane of incidence. Since this dark field mode collects light outside of the plane of incidence, this mode is categorized as double dark field. The double dark field technique often obtains maximum sensitivity when the collection angle is greater than 70 degrees from normal, which is well outside the range of a 0.9 NA objective. This makes the combination of the double dark field mode and other imaging modes such as bright field and laser directional dark field difficult.

Three physical embodiments for performing dark field imaging are presented in FIGS. 1-3. FIG. 1 presents a directional dark field system 100 which illuminates the object 101 using a laser beam 102 directed at a high angle of incidence. Light contacting an anomaly is scattered or diffracted upward through collector 103, lens 104, and finally to the image plane 105.

FIG. 2a is side view of a double dark field design system 200 which illuminates the object 201 using laser beam 202 directed at a relatively low angle of incidence. Collectors 203 and 204 are mounted at different angles from the laser beam 202, typically 90 degrees. FIG. 2b illustrates a top view of the system with the collectors 203 and 204 mounted 180 degrees from one another and 90 degrees from the laser 202. Variations of these angles are possible. This provides enhanced collection capability and allows detection of particular object faults.

FIG. 3a illustrates a variation of a central dark ground imaging system 300, wherein the laser beam 301 passes through the collector 302 at an approximately perpendicular angle to the object 303. The light beam strikes the object and is diverted, depending upon the features encountered, toward various collectors mounted about the object. Four collectors 305-308 in FIG. 3b have been employed in the past, each at an angle 90 degrees from the nearest collectors, as shown in FIG. 3b. Different numbers of collectors may be used at various angles depending upon the type of object scanned and the defects anticipated.

The drawbacks of these prior. dark field systems are twofold. First, physical limitations tend to restrict the angle at which light beams may be applied to the object, i.e. at either extremely deep or extremely shallow angles. This angular limitation tends to impede a full examination of the object. For example, if a type of defect may be detected best when light is applied at a 45 degree angle, such defects may not be apparent when the illumination source is limited to an angle less than 45 degrees. Secondly, these systems only employ one dark field mode each, which again tends to limit the types of defects which may be detected. Any attempt to combine different dark field imaging systems would be severely inhibited due to physical component placement restrictions and the inherent cost associated with multiple components.

With respect to the use of a single imaging mode, different schemes have varying performance advantages. For example, a double dark field arrangement is useful when small particles exist on the object, or rough films are expected to be encountered. Microscratches are best detected using normal incidence illumination and off normal imaging. Grazing incidence and back scattering may be used to detect missing contacts or vias on semiconductor wafers, while full sky mode best address metal grain variations. As the types of defects which may be encountered vary depending on many manufacturing factors, it would be best to inspect object for all of these defects. The problem, however, is that no single mode provides these capabilities, nor is a combination of these modes physically realizable nor economically feasible. Further, the use of multiple arrangements running over different machines negatively effects the scanning, processing, and evaluating time for each specimen.

It is therefore an object of the present invention to provide an apparatus that can incorporate as many imaging modes as possible and still maintain image quality and throughput requirements. Such an apparatus would be based on a high NA catadioptric objective with highly flexible illumination and imaging capabilities. Several prior catadioptric systems have been developed for microscopic inspection. While these systems may have a similar appearance to the present invention, they simply do not have the capability to integrate multiple inspection modes.

One apparatus previously used for microscopic inspection is the catadioptric bright field imaging system disclosed in U.S. Pat. No. 5,031,976, issued Jul. 16, 1991 to Shafer and assigned to KLA Instruments, which is hereby incorporated by reference. The system employs a focusing lens, a field lens, and a spherical mirror to focus and reflect light toward an object and back through an aperture located in the spherical mirror. The broadband aspects of the system disclosed do not directly translate to dark field imaging, but the patent does present an apparatus capable of 0.6 NA broad-band UV imaging for the deep ultraviolet spectral region, i.e. approximately 0.19 to 0.30 micron wavelengths.

The '976 patent is based on the Schupmann achromatic lens principle, which produces an achromatic virtual image, wherein an achromatic real image is produced from the virtual image using a reflective relay. The lens system is formed from a single glass type, fused silica. A series of lenses and mirrors is used to correct for aberrations and focus the light.

The system used in the '976 patent is shown in FIG. 4. The system includes, an aberration corrector lens group 401 for correcting image aberrations and chromatic variation of the image aberrations, a focusing lens 403 for receiving light from the group 401 and producing an intermediate image plane at plane 405, a field lens 407 of the same material as the other lenses placed at the intermediate image plane 405, a thick lens 409 with a plane mirror back coating 411 whose power and position are selected to correct the primary longitudinal color of the system in conjunction with the focusing lens 403, and a spherical mirror 413 located between the intermediate image plane and the thick lens 409 for producing a final image 415. Most of the focusing power of the system is due to the spherical mirror 413 which has a small central hole 417 near the intermediate image plane 405 to allow light from the intermediate image plane 405 to pass through to the thick lens 409. The mirror coating 411 on the back of the thick lens 409 also has a small central hole 419 to allow light focused by the spherical mirror 413 to pass through to the final image 415.

The '976 system is a catadioptric objective capable of 0.6 NA, with broad-band UV imaging over a 0.5 mm field. This limited NA and field size does not support high speed inspection with more than one dark field mode. An NA of 0.6 collects only 20% of the available solid angle above the sample object. The maximum field size for this system is 0.5 mm. This limits its maximum pixel size and data collection speed. For example, a system with 0.5 mm field size would only have 25% of the maximum pixel size and data collection speed compared to a system with a 2 mm field size. The thickness of the lens mirror element in the '976 patent prevents the system from being scaled up for larger field sizes. The objective is formed from fused silica and uses a positive fused silica field lens near the intermediate image to correct for low order lateral color. The thick lens mirror element is also used in the catadioptric group to compensate the chromatic variation in aberrations of the external lens group. This broad band objective also has no provision for laser illumination through the catadioptric elements.

U.S Pat. No. 5,488,229 to Elliott and Shafer and the associated continuation in part application, both of which are hereby incorporated by reference, provide a modified version of the optical system of the '976 patent, one which has been optimized for use in 0.193 micron wavelength high power excimer laser applications such as ablation of a surface 421' as seen in FIG. 5. This system has an aberration corrector group 401', focusing lens 403', intermediate focus 405', field lens 407' thick lens 409', mirror surfaces 411' and 413' with small central opening 417' and 419' therein and a final focus 415' as in the prior '976 patent, but repositions the field lens 407' so that the intermediate image or focus 405' lies outside of the field lens 407', to avoid thermal damage from the high power densities produced by focusing the excimer laser light. Further, both mirror surfaces 411' and 413' are formed on lens elements 408' and 409'. The combination of all light passing through both lens elements 408' and 409' provides primary longitudinal color correction of the single thick lens 409 in FIG. 4, but with a reduction in total glass thickness. Since even fused silica begins to have absorption problems at the very short 0.193 micron wavelength, the thickness reduction is advantageous at this wavelength for high power levels. Though the excimer laser source used for this optical system has a relatively narrow spectral line width, the dispersion of silica near the 0.193 micron wavelength is great enough that some color correction is still needed. Again, the system has a numerical aperture of about 0.6.

U.S Pat. No. 5,717,518 to Shafer, Chuang, and Tsai and the associated continuation-in-part application describe a catadioptric objective capable of high NA, ultra broad-band UV bright field imaging. This is a 0.9 NA system with very tight manufacturing tolerances, primarily due to the broad-band requirements of the design. The broad-band UV nature of the design is due in part to the use of two glass types, calcium fluoride and fused silica. Calcium fluoride has excellent UV transmission properties but it is not necessarily a desirable glass because it is difficult to polish, not mechanically stable, and expensive. Fused silica is a more desirable material because in addition to its good UV transmission it has desirable manufacturing properties.

The system in the '518 patent is shown in FIG. 6. The focusing lens group 11 consists of seven elements 21–27 with two of the lenses 21 and 22 separated from the remaining lens elements. These two lenses form a nearly zero power doublet for the correction of chromatic variation of monochromatic imaging aberrations. The five lenses 23–27 form the main focusing subgroup. The subgroup focuses the light to an intermediate image 13. The curvature and positions of the lenses in this subgroup are selected to minimize the monochromatic aberrations as well as cooperate with the doublet 21–22 to minimize chromatic variations of those aberrations. The field lens group 15 typically composes an achromatic triplet. Both fused silica and calcium fluoride glass materials are used. The catadioptric group 17 includes a meniscus lens 39 with a concave reflective surface coating 41. It also includes a second optical element consisting of a lens element 43 with a reflective surface coating 45 on a back surface of the lens. The first lens 39 has a hole 37 centrally formed along the axis of the optical system. Light from the intermediate image 13 passes through the optical aperture 37 in the first lens 39 and then throughout the body of the second lens 43 where it is reflected back by mirror surface 45. The light then returns through the body of 43 and the body of 39 to reflect off surface 41. The light, now strongly convergent, passes through the body of 43 and an aperture 47 in the reflective surface coating to form the final image 19.

Common problems with using several of these prior catadioptric optical systems for multiple imaging modes includes: these are complicated systems with tight manufacturing tolerances, they provide no illumination and imaging above 0.9 NA and a field of view less than 1 mm, pupil planes that are not easily accessible, and limited imaging modes and associated illumination schemes.

It is therefore an object of the present invention to provide a method and an apparatus which can incorporate as many imaging modes as possible while still meeting image quality and throughput requirements.

It is another object of the current invention to provide an effective, relatively simple and low cost imaging system having high optical performance and minimal inspection times.

It is a further object of the current invention to provide a high numerical aperture imaging system having high optical performance.

It is yet another object of the current invention to provide a system having a pupil plane at a location separate and apart from the lenses of the optical system, and providing the ability to magnify the resultant image over a range of magnification values.

SUMMARY OF THE INVENTION

According to a first aspect of the present invention, there is provided a method of imaging a specimen. The method comprises receiving illumination at an apparatus and transmitting light energy using a first portion of said apparatus to form an intermediate image, receiving the intermediate image from the first portion of the apparatus, and passing light energy to said specimen employing a second portion of said apparatus, wherein light energy passing employs a numerical aperture in excess of 0.65.

According to a second aspect of the present invention, there is provided a method for imaging an object, comprising transmitting illumination light energy toward said object and receiving the illumination light energy using a dome shaped reflective device, said dome shaped reflective device receiving reflected illumination light energy reflected from said object. Illumination light energy passing from said dome shaped reflective device to said object is applied to the object at a numerical aperture in excess of 0.65.

According to a third aspect of the present invention, there is provided a method for imaging an object, comprising providing a plurality of lenses oriented to receive light energy from an illumination source and pass light energy in a predetermined orientation, passing the light energy in said predetermined orientation toward the object through a reflective element and toward said object; and receiving light energy reflected from the object, wherein passing said light energy toward said object occurs with a numerical aperture in excess of 0.65.

These and other objects and advantages of all of the aspects of the present invention will become apparent to those skilled in the art after having read the following detailed disclosure of the preferred embodiments illustrated in the following drawings.

DESCRIPTION OF THE DRAWINGS

FIG. 22a is a six element varifocal tube lens group for providing magnifications from 20x to 200x; and FIG. 22b illustrates the four elements of the varifocal tube lens group furthest from the pupil plane.

DETAILED DESCRIPTION OF THE INVENTION

Figure 1:
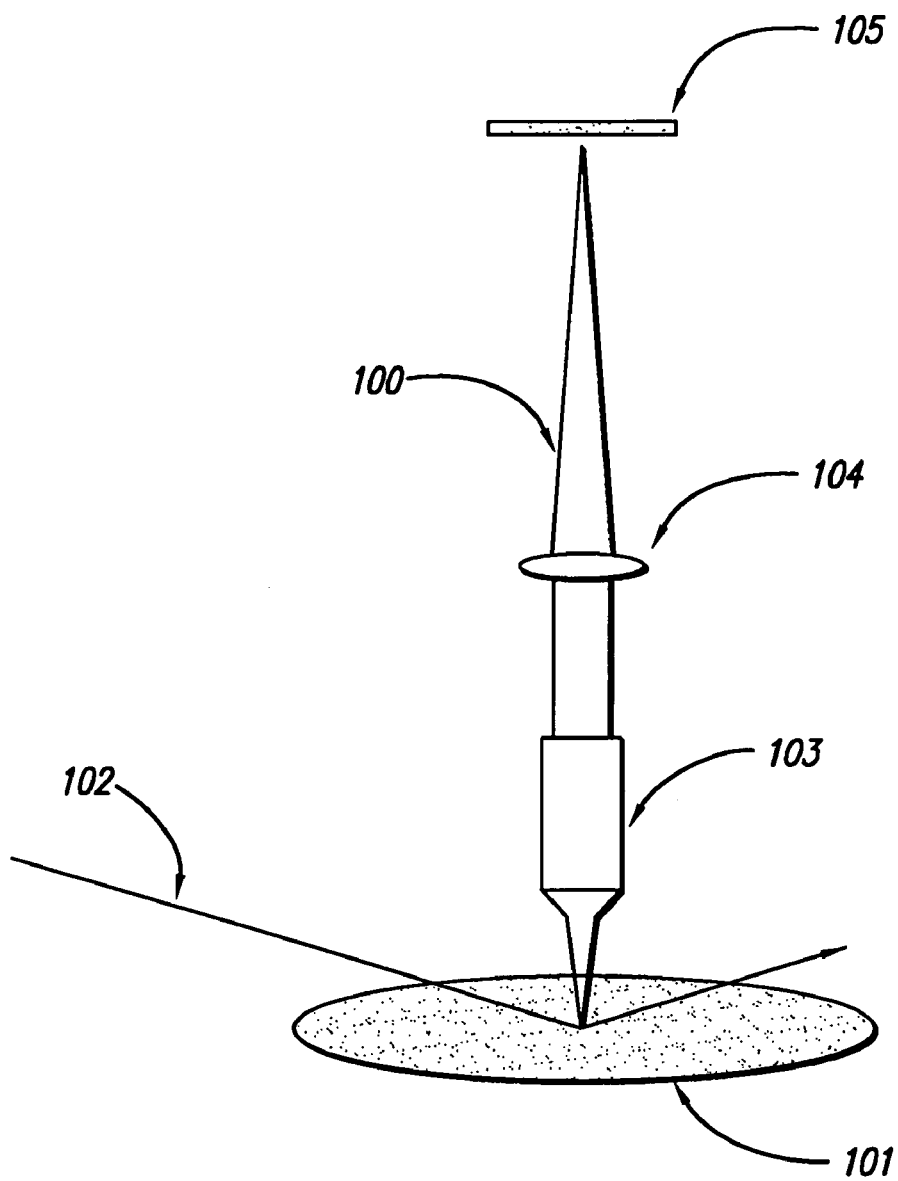
FIG. 1 is a directional dark field system which illuminates a object using angles of incidence up to 85 degrees from normal.

The present invention is a multiple mode catadioptric imaging method and apparatus for optical inspection. The inventive apparatus disclosed herein can combine the functions of several prior imaging modes and is based on a high NA catadioptric optical design. The system can be a narrow band system preferably having an NA greater than 0.90 that is highly corrected for low and high order monochromatic aberrations.

The high NA catadioptric design disclosed herein may be used and optimized for light having different wavelengths, from infrared to the deep ultraviolet. For example, in the ultraviolet spectrum, light beams having wavelengths of 193 nm, 213 nm, 244 nm, 248 nm, 257 nm, 266 nm, and so forth are possible using the concepts disclosed herein, with adjustments that would be apparent to those of ordinary skill in the art.

An example of an inventive apparatus that supports multiple mode imaging is disclosed. This apparatus is a 0.97 NA catadioptric optical design having a 1 millimeter field size is that optimized for a 266 nm wavelength and uses only fused silica. The design includes a catadioptric group and a focusing optics group proximate to an intermediate image. Light scattered, diffracted, and reflected by the object is collected by the catadioptric group which forms an intermediate image. The focusing optics group then corrects the aberrations present in the intermediate image. The working distance of the design presented is 0.5 millimeters. The central obscuration is less than to 10% of the pupil diameter, and the system can have a Strehl ratio of better than 0.98 over the entire field.

The catadioptric group includes a fused silica single near flat reflector and a dome-shaped reflector arranged in a catadioptric group. The near flat reflector can be a parallel fused silica plate having zero power, thereby making the catadioptric group easy to align. The focusing optics group includes eight lens elements in one embodiment. The focusing optics group corrects for high order spherical aberration and coma.

The ultra high NA disclosed allows for a variety of flexible illumination schemes. Illumination angles from 0 to approximately 85 degrees can be easily implemented thereby allowing maximum flexibility when choosing an illumination angle.

The catadioptric optical system has two primary methods for illumination. First, light energy can enter through the lenses of the optical system at angles between 0 and the collection angle defined by the objective NA. Second, for oblique illumination at angles from about 12 to 85 degrees, the preferred method of is by introducing the illumination through an aperture in the coating of the dome-shaped reflector. Light energy may illuminate the object at angles from 12 to 85 degrees from the normal. With proper mirror design, a beam introduced through an aperture in the mirror coating maintains the same angle with respect to the wafer when it exits the near flat reflector. In addition, the catadioptric group will not add any power to the illumination beam. The aperture required in the mirror coating of the catadioptric group may be a slit of non-mirrored surface where light energy is applied.

Multiple beams at multiple angles may also be used for illumination. For example, two beams separated azimuthally by 90 degrees may be used for illumination to minimize shadowing effects, with appropriate apertures provided.

The catadioptric imaging system effectively collects light scattered, diffracted, and reflected at different angles by the wafer and maps these scattering angles to a plane. This plane is located at the pupil of the system and each position on this pupil plane corresponds to a position on dome-shaped reflector. Each location in the pupil plane corresponds to different scattering angles, and apertures placed at this pupil plane can be used to limit the range of scattering angles reaching the image detector. This pupil plane roughly corresponds to the Fourier plane of the wafer. Such a system supports collection NAs up to 0.99

The wide range of illumination and collection angles possible with the system supports multiple imaging modes. These modes include but are not limited to: variable NA bright field, full sky, ring dark field, inverted ring dark field, directional dark field, double dark field, central dark ground, Manhattan geometry, confocal bright field, confocal dark field, and well as conoscopic imaging. Other schemes are possible in which the illumination angle is between 0 and approximately 85 degrees and the collection angle between 0 and approximately 82 degrees.

The variable NA bright field imaging mode may be employed using the apparatus disclosed herein. The illumination of the wafer in this system is similar to that in a standard microscope. The light can be injected into the optical system using a beam splitter and then projected through the optical system to the object to be inspected. Variable NA illumination can be obtained by using an aperture at the objective pupil, in the collimated range of the objective, or in separate optics before the beam splitter. The light reflected, scattered, and diffracted from the object returns through the objective and through the beam splitter. Variable NA of the light from the object can be obtained by using an aperture at the objective pupil or in the collimated range of the objective. An image is formed on a detector using additional lenses as described in the embodiments below. Such a bright field imaging technique can also operate in full sky mode. In this mode the image contains light scattered at angles up to the maximum possible NA of the objective. The full sky mode is most effective when the collection NA is near 0.99.

Alternately, the apparatus disclosed herein can operate in ring dark field imaging mode. This is a standard type of dark field imaging where the illumination angles are limited to a high NA ring and the imaging angles are limited to the NAs less than those used by the ring illumination. The ring illumination can be injected into the optical system using a beam splitter. The low NA imaging can be obtained by placing an aperture at the pupil plane of the objective to limit the angles reaching the detector. This system can also operate in inverted ring dark field mode. This mode is the inverse of the previous system and uses low NA bright field illumination and a high NA ring for imaging.

The apparatus disclosed herein can operate in directional dark field imaging mode. This mode uses oblique illumination as described above and can collect scattered light from the object up to the full angular range of the catadioptric objective. Collecting only the desired portion of the scattered and diffracted light is accomplished by using an aperture in the pupil plane or in the collimated range of the objective.

Alternately, the apparatus disclosed herein can operate in the double dark field imaging mode. This mode uses oblique illumination and collects the near 90 degree azimuthal portions of the scattered and diffracted light. The system uses an aperture in the pupil plane or in the collimated range to limit the collection to the near 90 degree azimuthal portions of scattered and diffracted light.

Additionally, the apparatus disclosed herein can operate in the central dark ground imaging mode. This mode uses normal illumination by directing light through the optical system at an angle from approximately 0 to 12 degrees from the normal of object being inspected. In this mode the specular reflection from the wafer is blocked and remaining portions of the scattered and diffracted light are transferred to the detector.

The apparatus disclosed herein can also operate in the Manhattan geometry imaging mode. This mode can use normal illumination as described in the central dark ground mode or oblique illumination as described in the directional dark field mode. The Manhattan geometry uses high angle light collection from four different quadrants.

Additionally, the inventive system disclosed herein can operate in the bright field confocal imaging mode. This mode takes advantage of the short depth-of-focus obtainable by using a high NA objective and short wavelength illumination. Bright field confocal mode illuminates the object with a single point or a line focus. The illumination spot on the object is then imaged through an aperture in front of a detector. The object, illumination spot, aperture, or a combination thereof are then scanned to collect information about an area on the object being examined.

Additionally, the system can operate in the dark field confocal imaging mode. The dark field confocal imaging mode also takes advantage of the short depth-of-focus obtainable by using a high NA objective and short wavelength illumination. This unique imaging mode is made possible by the high NA diffraction limited illumination. High NA ring illumination produces a diffraction limited spot or line and the remaining NA can support diffraction limited imaging. The illumination spot on the object is imaged, using an NA that is less than the illumination NA, through an aperture in front of a detector. The object, illumination spot, aperture, or a combination thereof are then scanned to collect information about an area on the object being examined.

Additionally, the apparatus disclosed herein can operate in the conoscopic imaging mode. This mode can use either oblique or normal illumination, and lenses are not required to form an image on a detector. The light at the pupil plane or in the collimated range of the objective can be placed directly on a single detector, multiple detectors, or detector array.

As may be appreciated from the previous paragraphs, the inventive concept disclosed herein is that multiple imaging modes can be implemented using a single ultra high NA optical system or machine. This is possible because of the wide range of illumination and imaging angles supported by this optical system. Illumination angles from 0 to 85 degrees from normal can be easily implemented, thereby allowing maximum flexibility when choosing an illumination angle. Collection angles from 0 to 82 degrees from normal are also possible. Different illumination schemes and different pupil filters are used to select the different imaging modes.

The narrow band catadioptric optical system disclosed herein may be designed with NAs up to 0.99 in air. The system can also be designed with field sizes of greater than 2 mm. Such a system has relaxed manufacturing tolerances and only requires a single glass material. One embodiment of the system disclosed herein provides increased field size, including up to 4.0 mm of field size.

A further embodiment of the current design provides a relayed pupil for better access to the Fourier plane. Transferring the pupil to an external plane affords easy simultaneous operation of various imaging schemes. Additionally, a tube lens group can be used with any of these objective designs to provide a magnified image of the object being inspected. Different tube lens groups may be used to obtain different magnifications. The tube lens groups can be designed to have a distant exterior pupil plane to match the buried interior pupil plane of the catadioptric objectives. A tube lens group can also be designed to work with an objective with a relayed pupil.

Still another embodiment of the current system is a six element varifocal tube lens group which can be independently corrected from the main system and which provides magnification of the image from 20× to 200×.

Figure 7:
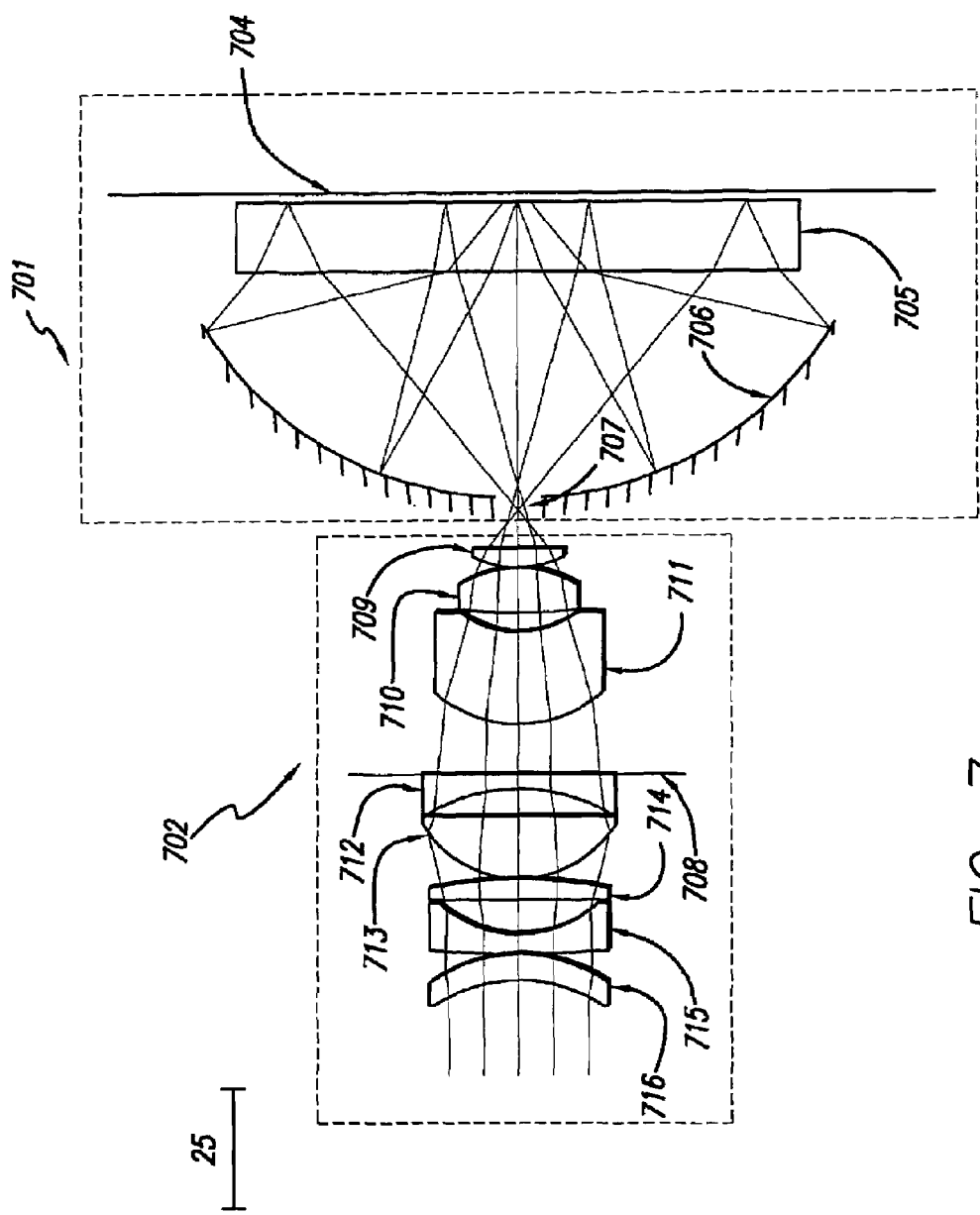
FIG. 7 is a multimode catadioptric dark field imaging system in accordance with the current invention and constructed to have a 0.97 NA.

Referring now to FIG. 7, shown is a figure illustrating an apparatus that combines the functions of several imaging systems. This apparatus, based on a high NA catadioptric optical design, is a narrow band optical system having an NA greater than 0.90 and is highly corrected for low and high order monochromatic aberrations. The system of the present invention may have a numerical aperture of greater than 0.65. Preferably the numerical aperture is greater than 0.90. The field size preferably ranges from 0.5 to 2.0 mm.

This high NA catadioptric optical design has been optimized with emphasis on manufacturability and flexibility for a multiple mode optical inspection system. Previous catadioptric systems were primarily optimized for broad band performance. For this reason these prior systems had NAs limited to 0.90 and field sizes limited to 1 mm. Previous designs had a tendency to be highly complicated with tight manufacturing tolerances and required two glass materials, which could add considerable cost.

The high NA catadioptric optical system disclosed herein may have an NA in air up to 0.99 and a field size of greater than 1 mm. Such a system has relaxed manufacturing tolerances and only requires a single glass material. Use of a single glass material in the catadioptric system is very advantageous when the system is optimized for the spectrum below 300 nm because only a few glasses with high transmission are available.

The high NA catadioptric objective disclosed herein may be used and optimized for light beams having different wavelengths, from the infrared to the deep ultraviolet. For example, in the ultraviolet spectrum, light beams having wavelengths of 193 nm, 213 nm, 244 nm, 248 nm, 257 nm, 266 nm, and so forth are possible using the concepts disclosed herein, with adjustments that would be apparent to those of ordinary skill in the art. For wavelengths from 110-200 nm, fluoride glasses will be used because of their good transmission properties.

One of key advantages of this catadioptric optical system is the high quality imaging performance at numerical apertures (NAs) up to 0.99. This NA range represents the capability to illuminate and image at very high angles of incidence. The relationships between the numerical aperture in air and the angle of incidence to the sample are that NA=n * sin(angle of incidence)

where the index n has a value of 1.000 for air. The following table summarizes the relation between NA and the angle of incidence in air:

| NA (in air) | Angle of incidence (degrees) |
|---|---|
| 0.90 | 64 |
| 0.91 | 66 |
| 0.92 | 67 |
| 0.93 | 68 |
| 0.94 | 70 |
| 0.95 | 72 |
| 0.96 | 74 |
| 0.97 | 76 |
| 0.98 | 79 |
| 0.99 | 82 |

FIG. 7 is a 0.97 NA design having a 1 millimeter field size. The design is optimized for a 266 nm wavelength and uses only fused silica. The system has a Strehl ratio of 0.98 and can resolve on the order of 6,000 spots along one dimension of the 1 mm field. As will be discussed below, increased field sizes are achievable using this system. For a 1.5 mm field size, the Strehl ratio decreases to 0.95 and the number of resolvable spots along one dimension of the field increases to approximately 9,000. For a 2.0 mm field size, the Strehl ratio decreases to 0.85 and the number of resolvable spots along one dimension of the field increases further to approximately 12,000. An increase in the number of resolvable spots increases the efficiency for a given configuration and faster inspection of an object is possible. Possible applications of this optical system include wafer and photomask inspection, material masking and cutting operations, UV lithography, biological microscopy, metallurgical microscopy and others.

Note that the elements of FIG. 7 are drawn to scale, with the number and line in the upper left corner indicating a distance in millimeters, here 25 millimeters. This notation is used throughout several figures included herein.

The design in FIG. 7 includes a catadioptric group 701 proximate to an intermediate image, and a focusing optics group 702. Light scattered, diffracted, and reflected by the object 704 is collected by the catadioptric group 701 which forms an intermediate image 707. The focusing optics group 702 corrects for the aberrations present in the intermediate image. The working distance of the design presented in FIG. 7 is 0.5 millimeters, or a distance of 0.5 millimeters exists between the object 704 and the single refractive element 705. The central obscuration is limited to 10% of the beam diameter.

From FIG. 7, catadioptric group 701 includes near flat reflector with a reflective surface coating 705 and a dome-shaped reflector 706. The near flat reflector with a reflective rear surface coating 705 can be a parallel fused silica plate having zero power, thereby making the catadioptric group portion easy to align. Focusing optics group 702 includes first focusing lens element 709, second focusing lens element 710, third focusing lens element 711, fourth focusing lens element 712, fifth focusing lens element 713, sixth focusing lens element 714, seventh focusing lens element 715, and eighth focusing lens element 716. The focusing optics group 702 corrects for high order spherical aberration and coma. The focusing optics group design uses a field lens concept originally developed by Offner, but the Offner design only works for systems having near zero field size. The large fields in these objective designs require unique optimization techniques. The complexity and shapes of the lenses in the focusing group 702 become extremely critical for high NA values, such as those exceeding 0.90, and for large field sizes. This design has been chosen to minimize the incidence angles of the light on the lens surfaces which can minimize reflection losses and improve tolerance sensitivities.

The ultra high NA disclosed allows for a variety of flexible illumination schemes. Illumination angles from 0 to 85 degrees can be easily implemented, thereby allowing maximum flexibility when choosing an illumination angle.

Figure 8:
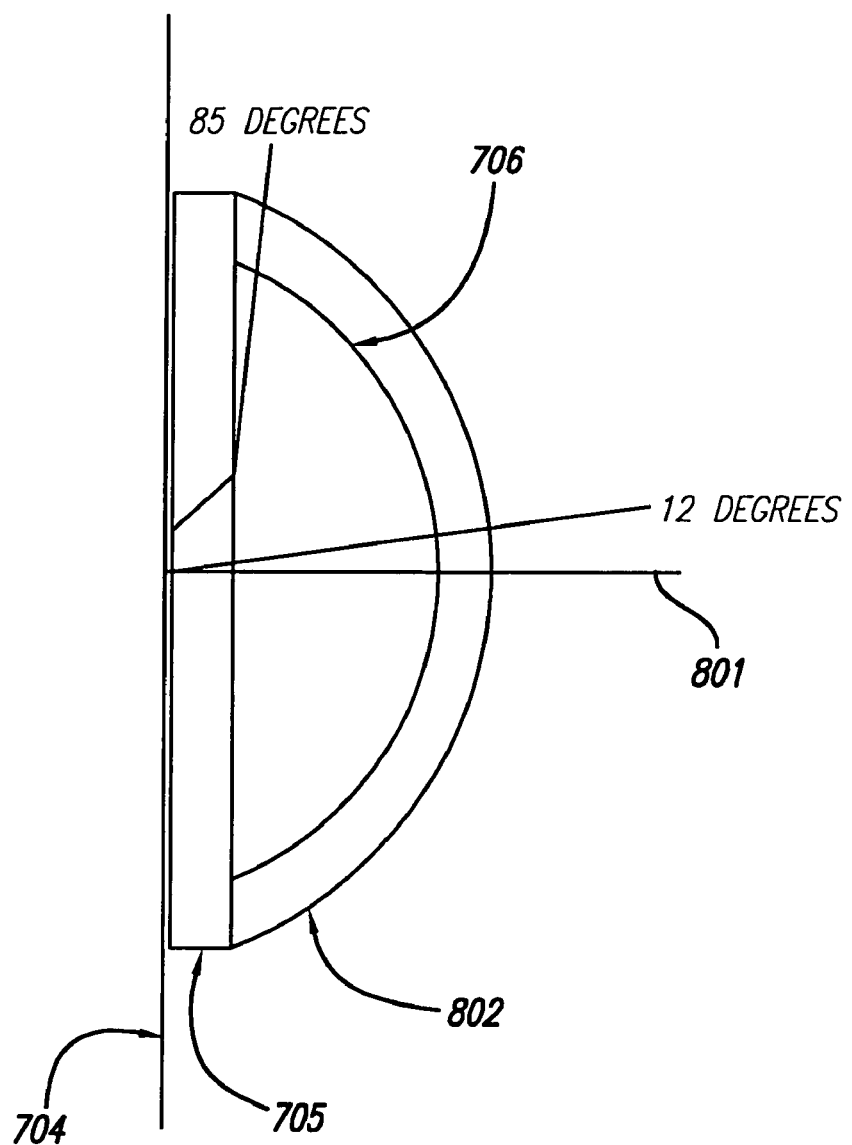
FIG. 8 is a cutaway side view of dome-shaped reflector and the fused silica lens mirror element.
Figure 9:
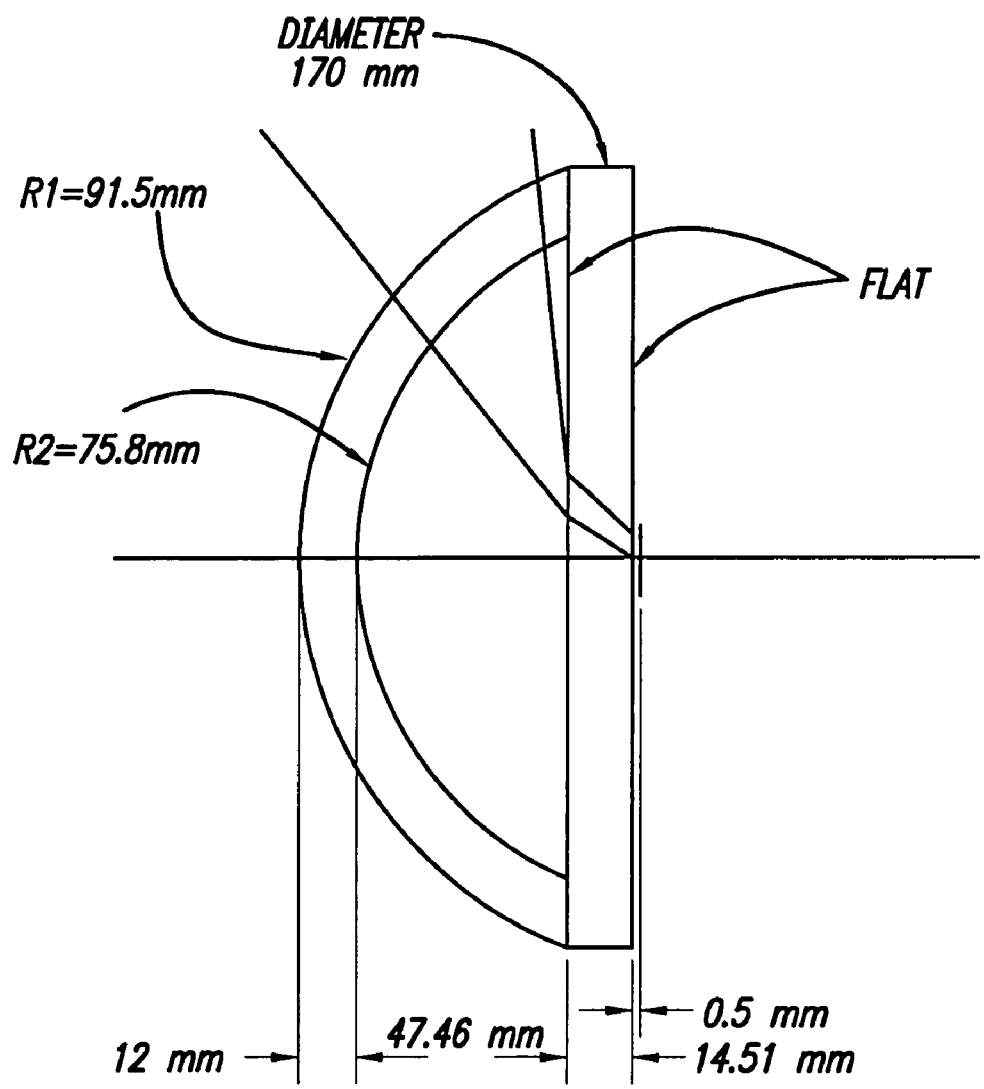
FIG. 9 illustrates the dimensions of the catadioptric group in one embodiment.

The catadioptric optical system has two primary methods for illumination. First, light energy can enter through the lenses of the optical system at angles from 0 to the angle defined by the objective NA. Second, for oblique illumination at angles from about 12 to 85 degrees, the preferred method is by introducing the illumination through an aperture in the coating of the dome-shaped reflector as shown in FIG. 8. As a result, illuminating light only passes through a few surfaces, thereby reducing the potential for multiple surface reflection and scattering to reach the imaging detector. As shown therein, a beam introduced through an aperture in the mirror coating 706 maintains the same angle with respect to the wafer 704 when it exits the objective. In other words, illumination introduced at an angle of 85 degrees to the normal 801 exits the fused silica single refractive element 705 at the same 85 degree angle. For the lens design shown in FIG. 7, the dimensions for the catadioptric group to provide uniform angles of incidence are as shown in FIG. 9. The thickness of fused silica near flat reflector 705 is 14.51 mm with a diameter of 170 mm. The dome-shaped reflector 706 has an inner radius of curvature of 75.8 mm, and an outer radius of curvature of 91.5 mm. The distance on the centerline between the inner edge and the outer edge of the dome-shaped reflector 706 is 12 mm, and the distance from the inner edge of the dome-shaped reflector to the fused silica near flat reflector 705 is 47.46 mm.

If the design is reoptimized by changing the thickness or radius of curvature of the near flat reflector 705 or the inner radius of the dome-shaped reflector 706, the thickness and/or outer radius of curvature 802 of dome-shaped reflector 706 should be modified to preserve the angle of illumination. Under oblique illumination, in addition to preserving the angle when a beam enters and exits the objective, the catadioptric elements do not introduce any power to the illumination beam. A collimated beam of light energy entering through an aperture in a mirror coating will be collimated when it exits the objective. The aperture in coating of the dome-shaped reflector 706 may include a slit of non-mirrored surface, single holes of non-mirrored surface, a physical hole in the mirror, a partial mirror coating, or a coating that selectively transmits the wavelength of interest. In addition, multiple beams at multiple angles may also be used for illumination. For example, using oblique illumination, two beams separated azimuthally by approximately 90 degrees may be used for illumination to minimize shadowing effects.

The catadioptric imaging system effectively collects light scattered, diffracted, and reflected at different angles by the object and maps these scattering angles to a plane. This plane is located at the pupil of the system and each position on this pupil plane corresponds to a position on the dome-shaped reflector 706. Each location in the pupil plane corresponds to different scattering angles, and apertures placed at this pupil plane can be used to limit the range of scattering angles reaching the image detector. This pupil plane roughly corresponds to the Fourier plane of the object. Such a system supports collection NAs up to 0.99 for illumination angles between 0 and 85 degrees.

The wide range of illumination and collection angles possible with this catadioptric optical system allows it to support multiple imaging modes. These modes include, but are not limited to, variable NA bright field, full sky, ring dark field, inverted ring dark field, directional dark field, double dark field, central dark ground, Manhattan geometry, confocal bright field, confocal dark field, as well as conoscopic imaging. Many other schemes are also possible in which the illumination angle is between 0 and approximately 85 degrees and the collection angle between 0 and approximately 82 degrees.

Variable NA bright field mode may be employed using the inventive concepts disclosed herein. The illumination of the object in this system is similar to that in a standard microscope. The light may be injected into the optical system using a beam splitter and then projected through the focusing group 702. Light energy then passes through the aperture in the dome-shaped reflector 706 and strikes the reflective surface on near flat reflector 705. Light energy then passes back through the near flat reflector 705, striking dome-shaped reflector 706, passing once again through the near flat reflector 705 to illuminate object 704. Note that the right surface of the near flat reflector 705 shown in FIG. 7 is necessarily clear, or non-opaque, at the center portion such that light may contact object 704 but has a reflective interior surface outside the center portion to provide reflectivity. Variable illumination NA can be obtained by using an aperture at the objective pupil plane, in the collimated range of the objective, or in separate optics before the beam splitter. The light passes through the objective and is then scattered, diffracted, and reflected from the object. The light from the object returns through the objective and through the beam splitter. The variable NA of the light from the object can be obtained by using an aperture at the objective pupil plane or in the collimated range of the objective. An image is formed on a detector using additional lenses as described in the embodiments below. The optical system described obtains optimum performance when narrow band illumination is used. Therefore, the bright field illumination in this system could be a narrow band laser or a broad band source with a narrow band filter. To reduce the problem of speckle and interference from narrow band light, a moving ground glass or some other technique to introduce random phase can be placed into the beam before light enters the objective.

Alternately, the inventive system disclosed herein can operate in full sky mode. This mode is a variation of the variable NA bright field mode described above. Full Sky uses the same type of variable NA illumination, however, the NA of the light collected from the object should be as large as possible. Imaging in this mode collects as much light as possible coming from the object, especially in the higher angles. This mode helps minimize contrast variations introduced by grain and rough films.

The system can also operate in ring dark field mode. This is a standard type of dark field imaging where the illumination angles are limited to a high NA ring and the imaging angles are limited to the NAs less than those used by the ring illumination. The ring illumination can be injected into the optical system using a beam splitter. The ring illumination can be formed by a ring reflector or by separate illumination optics previous to a beam splitter. To form the high NA ring in the separate illumination optics an aperture can be placed at an equivalent pupil plane. This method of forming the ring illumination has the drawback that the aperture blocks a substantial portion of the light. To avoid this, the ring can be formed by using one or more axicons, a diffractive optic, a holographic optic, a segmented optic, combinations of these devices, and so forth. The low NA imaging can be obtained by placing an aperture at the pupil plane of the objective to limit the angles reaching the detector.

Alternately, the system can operate in inverted ring dark field mode. This mode is the inverse of the previous system and uses the low NA's for illumination and a high NA ring for imaging. Variable low NA illumination can be obtained by using a low NA spot mirror or separate illumination optics before the beam splitter as described in the variable NA bright field section above. The high NA imaging can be obtained by placing an aperture at the pupil plane of the objective or in the collimated range to limit the angles reaching the detector.

Figure 10:
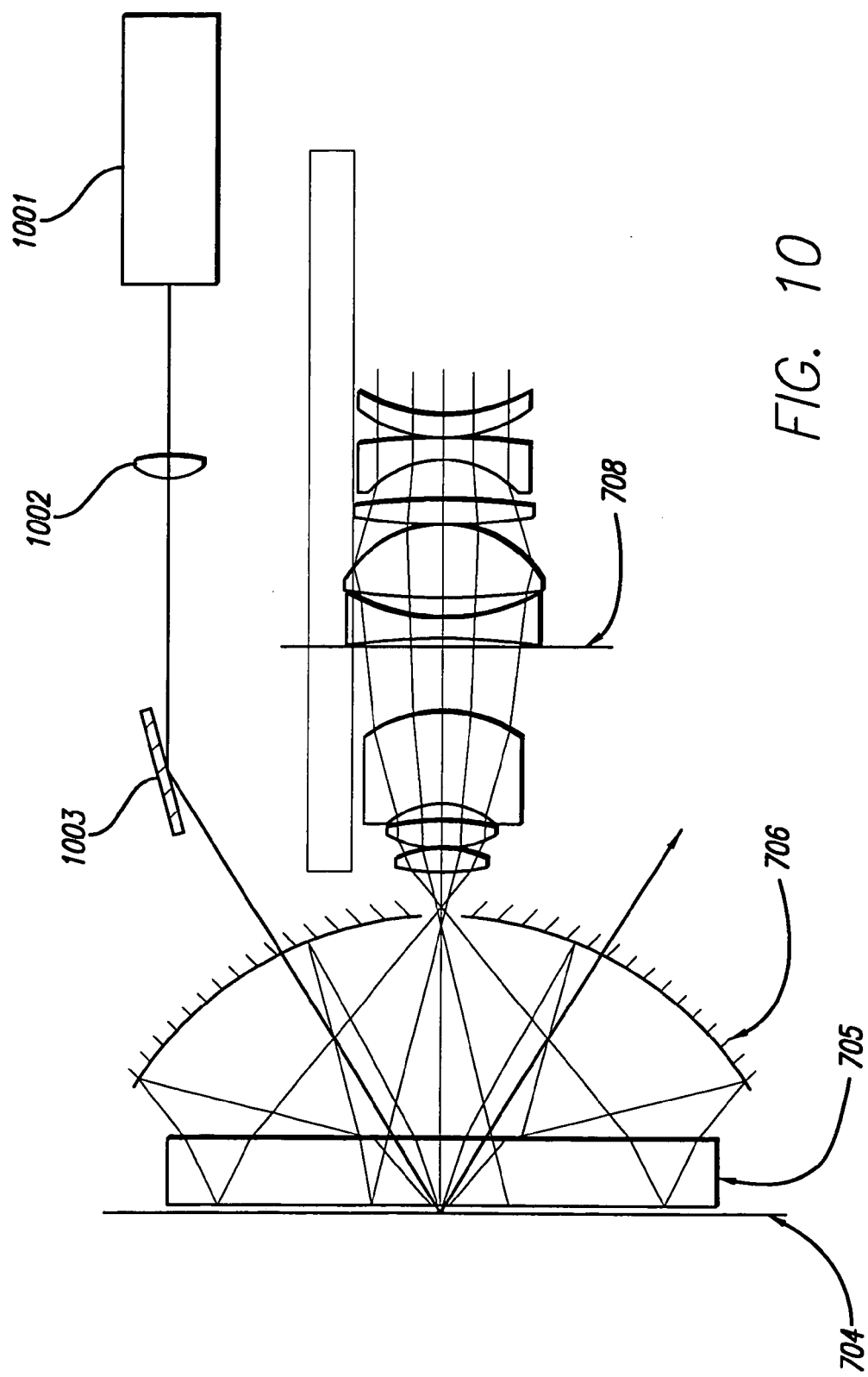
FIG. 10 presents a catadioptric dark field imaging system in accordance with the current invention and having a variable angle of incidence from an illumination source.

The system can also operate in directional dark field mode using oblique illumination, as shown in FIG. 10. Such an implementation can collect scattered and diffracted light from the object at variable NAs from the near normal portion of light to the full angular range of the catadioptric objective. In the directional dark field mode, the system illuminates the object by injecting the illuminating beam through an aperture in the mirror coating shown in FIG. 10. Illumination source 1001 emits a beam of light to lens 1002, which collimates the beam and transmits the beam to mirror 1003. Mirror 1003 directs the collimated beam through the dome-shaped reflector 706, striking the near flat reflector 705 and the object 704. The specular reflection from object 704 is transmitted out of the system through another aperture in the coating of the dome-shaped reflector 706. The scattered and diffracted light from the object 704 is collected by the dome-shaped reflector 706. The dome-shaped reflector 706 then reflects the light to lens mirror element 705 which in turn reflects the light to the imaging lenses in the system. Limiting the collection angles of the scattered and diffracted light is accomplished by using an aperture in the pupil plane or in the collimated range of the objective.

Figure 11:
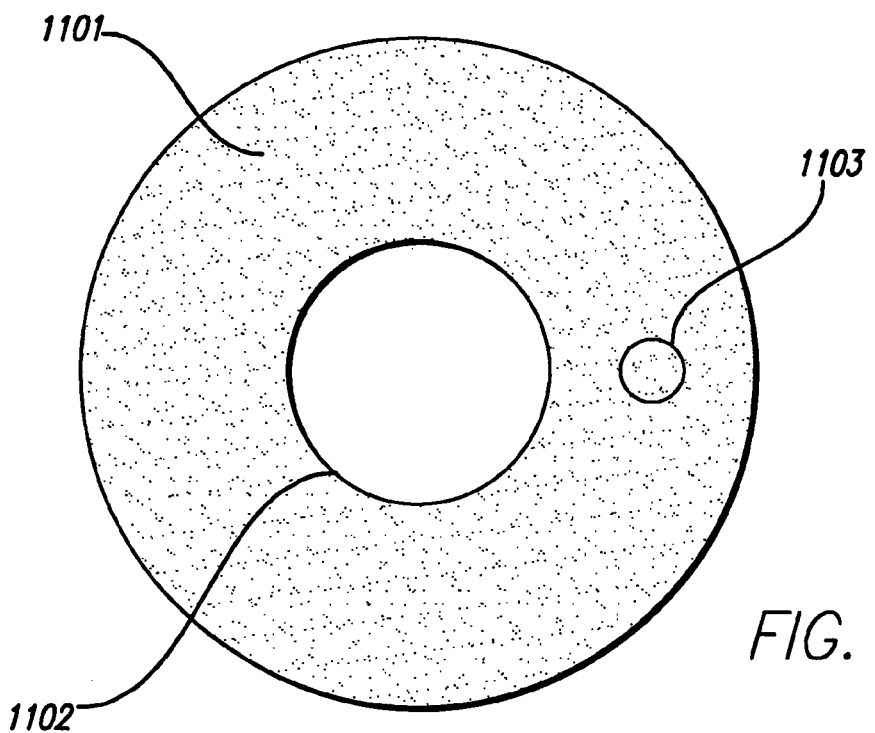
FIG. 11 is a pupil aperture which may be used with the catadioptric system when selecting the directional dark field mode.

Apertures of any size may be used from large apertures that transmit the full NA of the system to small apertures that transmit only the near normal light. FIG. 11 is an example of a pupil aperture 1101 that allows imaging light to pass through the central region 1102 and blocks light outside this area with annular block. Such an aperture can be used to limit collection angles to those less than the illumination angle.

Figure 2B:
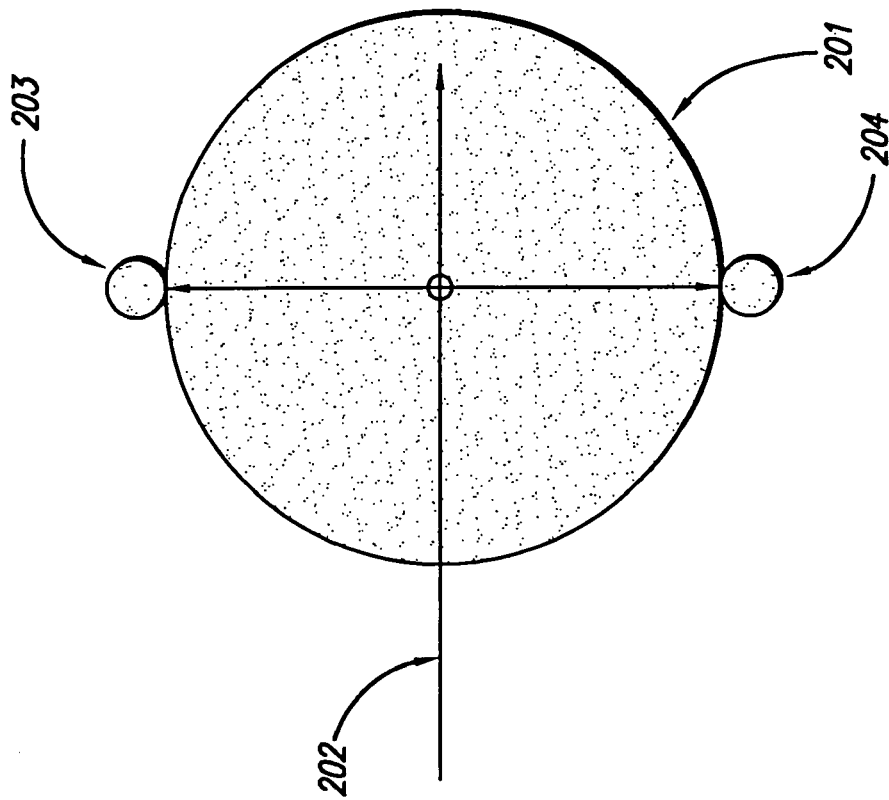
FIG. 2b is a top view of the double dark field system.
Figure 2A:
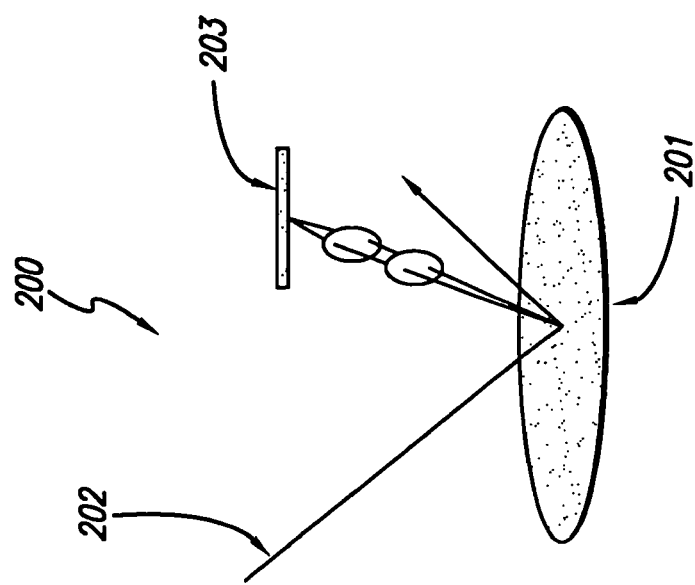
FIG. 2a illustrates a side view of a double dark field design system which illuminates the object at a relatively high angles of incidence.
Figure 12:
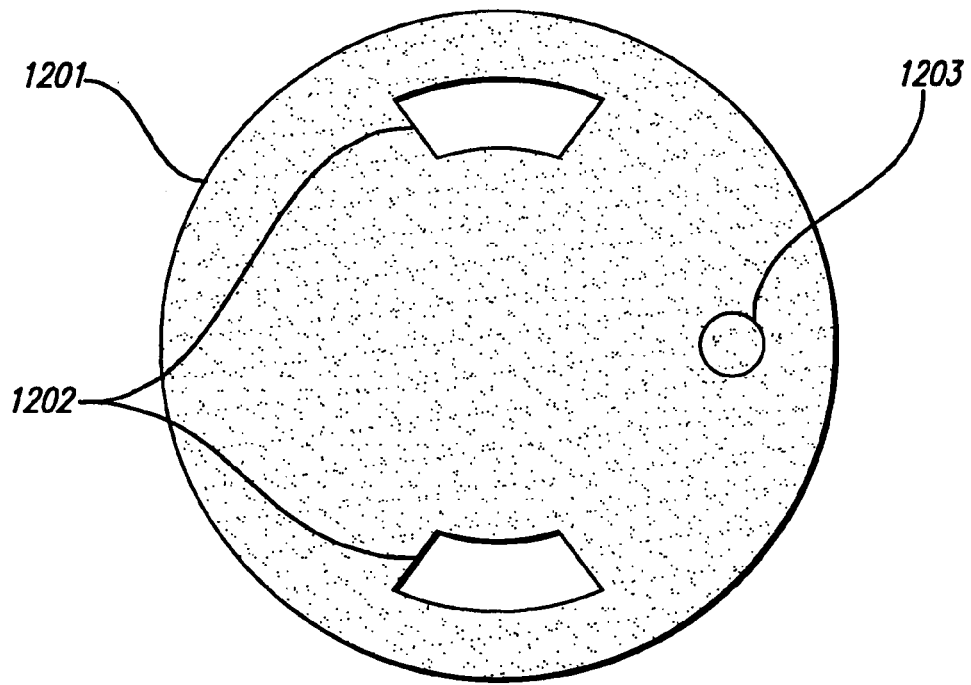
FIG. 12 presents an aperture which may be used with the catadioptric system when selecting the double dark field mode.

The system can further operate in double dark field mode using the oblique illumination and collecting the near 90 degree azimuthal portions of scattered and diffracted light. In the double dark field mode, the system illuminates the object by injecting the illumination through an aperture in the mirror coating as is done in the directional dark field case. The system uses an aperture in the pupil plane or in the collimated range to limit the collection to the near. 90 degree azimuthal portions of scattered and diffracted light. Such a collection aperture may be as shown in FIG. 12. The aperture 1201 illustrated in FIG. 12 has two apertures 1202 which collect the near 90 degree azimuthal scattering of a double dark field system such as that shown in FIGS. 2a and 2b.

Figure 13:
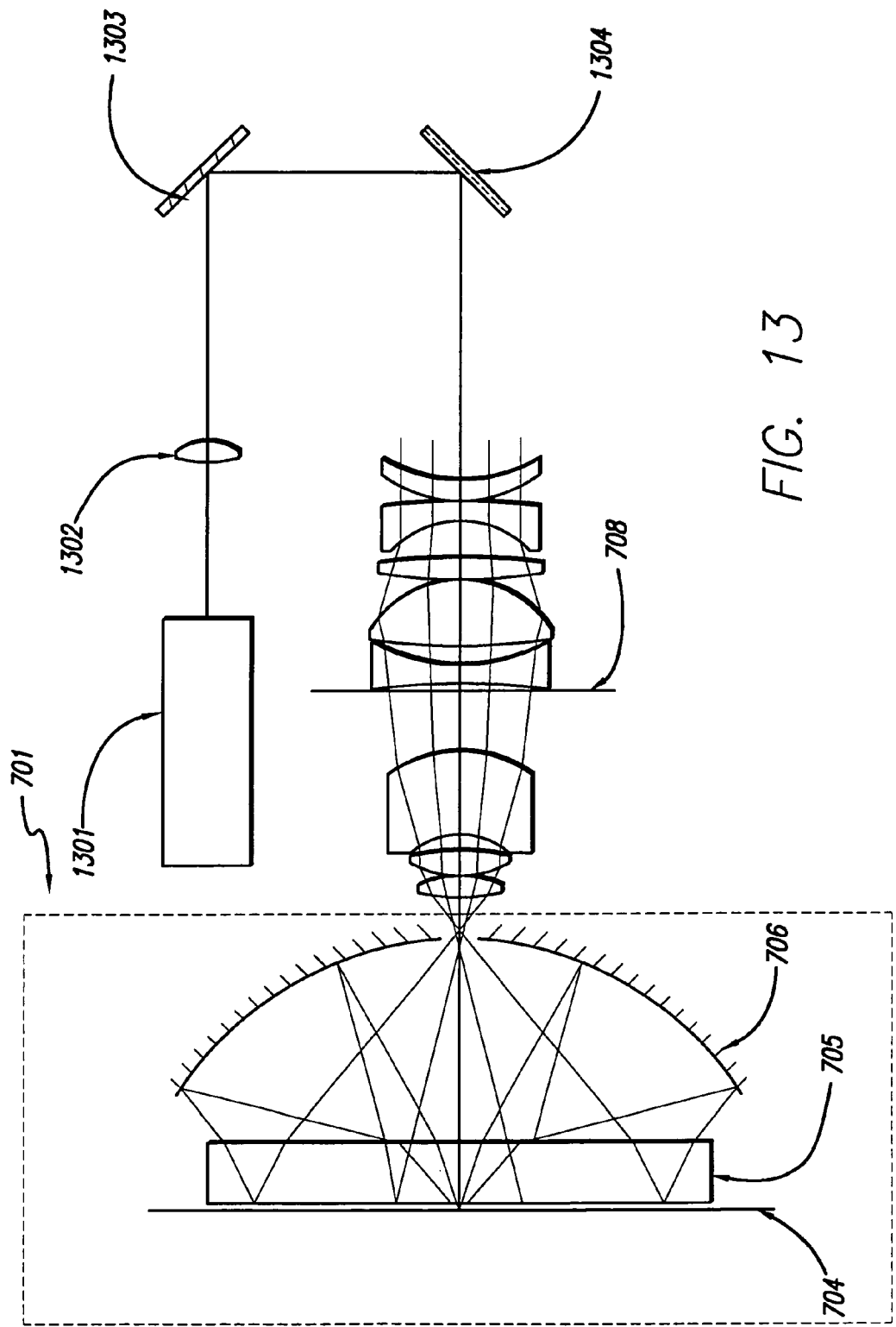
FIG. 13 illustrates operation in the central dark ground mode using normal illumination.

Additionally, the system can operate in the central dark ground mode using normal illumination illustrated in FIG. 13. In FIG. 13, illumination source 1301 emits a beam of light to lens 1302, which compensates for the power in the Focusing optics group 702 and transmits the beam to mirror 1303. Mirror 1103 directs the beam toward a spot mirror 1304, which directs the beam through the focusing optics group 702 and into the catadioptric group 701. The beam strikes the near flat reflector 705 at. an angle from approximately 0 to 12 degrees from the normal of the near flat reflector 705 then strikes the object 704. The scattered, diffracted, and reflected light from the object 704 is collected by the dome-shaped reflector 706. The dome-shaped reflector 706 then reflects the light to lens mirror element 705 which in turn reflects the light to the imaging lenses in the system. In this mode the specular reflection from the object is blocked and remaining portions of the scattered and diffracted light are transferred to the detector. The specular reflection can be blocked by the spot mirror 1304 or by an aperture placed in the pupil plane or the collimated range.

Figure 3B:
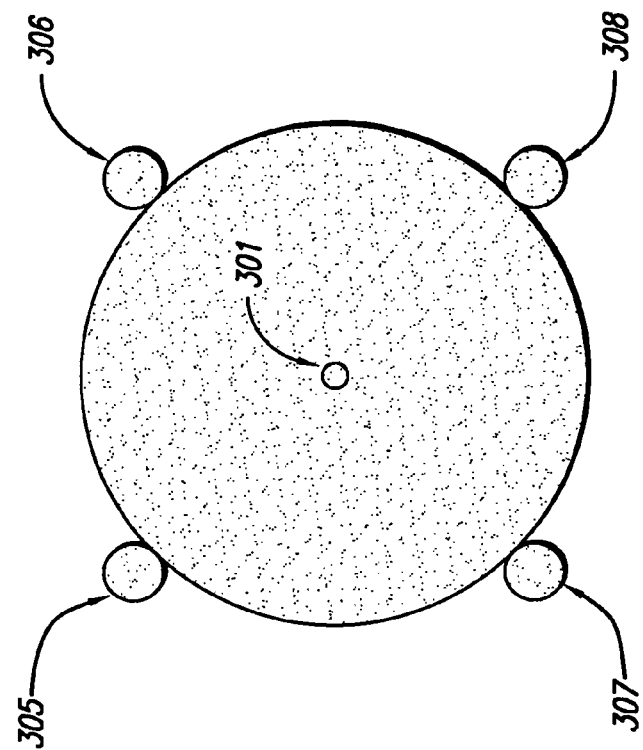
FIG. 3b is a top view of the normal dark field imaging system.
Figure 3A:
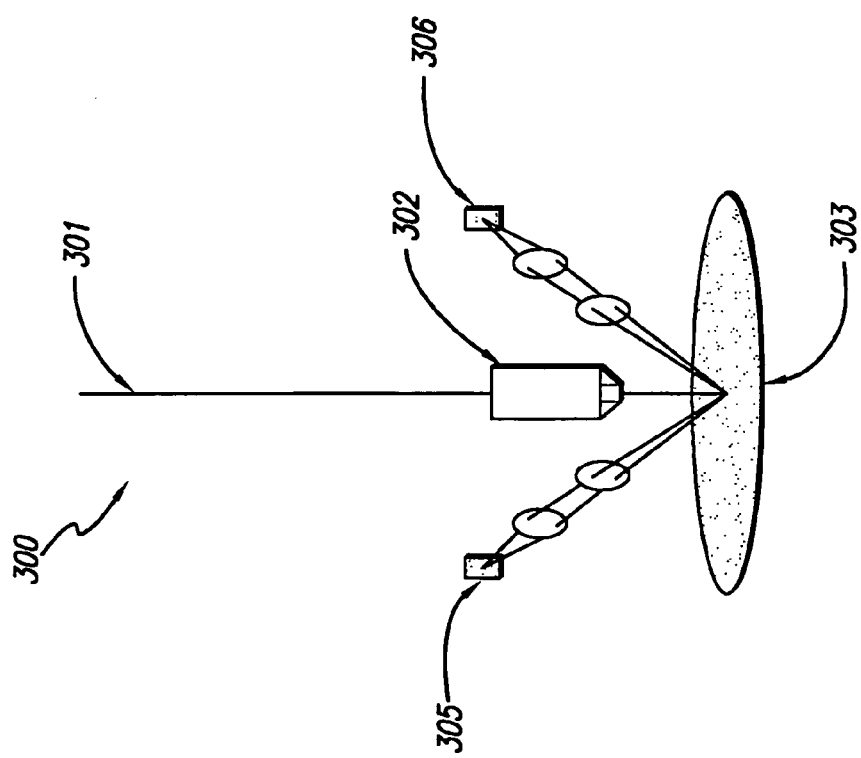
FIG. 3a presents a central dark ground imaging system wherein the laser passes through the collector at an approximately perpendicular angle to the object.
Figure 4:
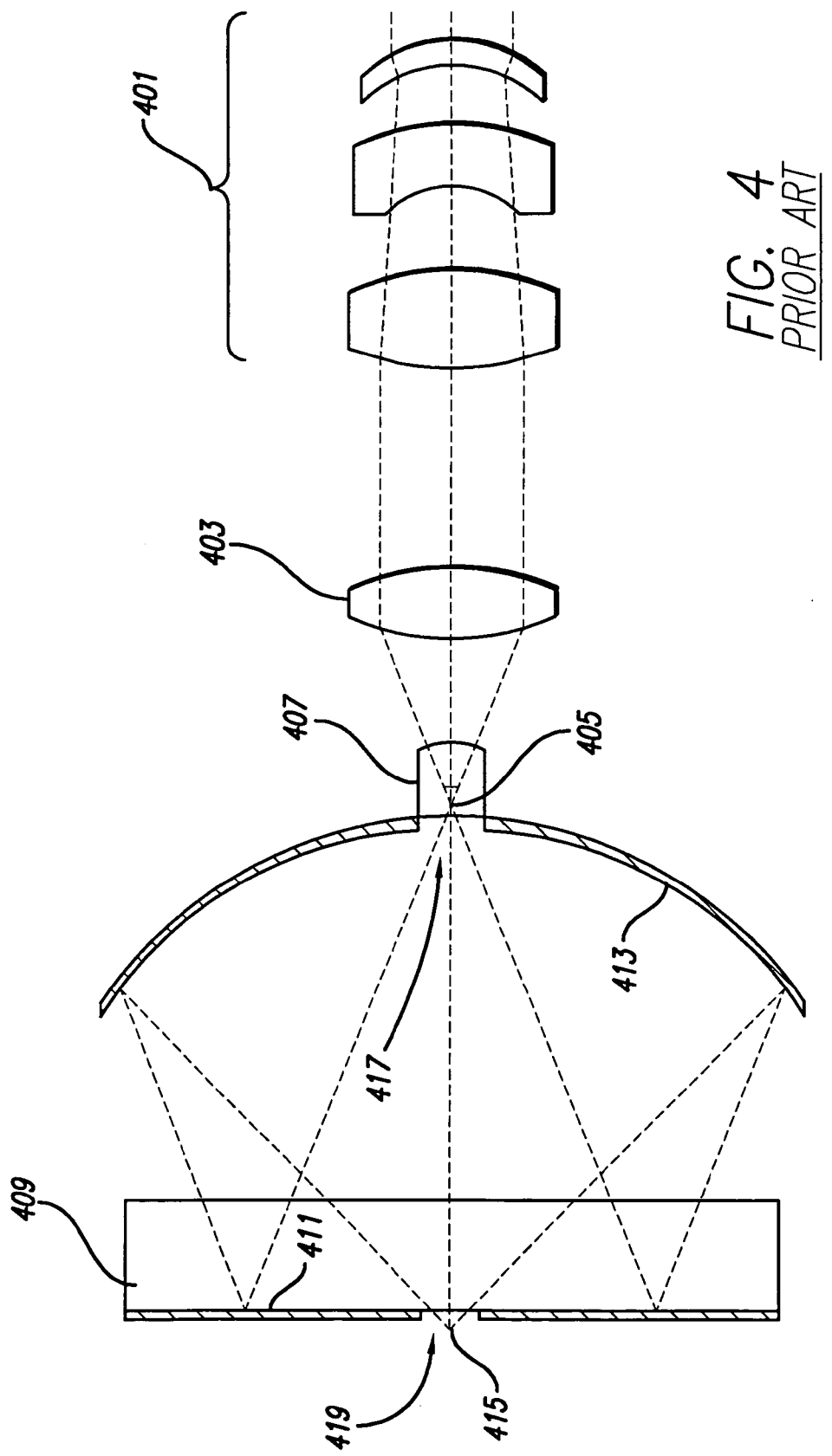
FIG. 4 illustrates a catadioptric bright field imaging system employing a focusing optics and a dome-shaped reflector.
Figure 5:
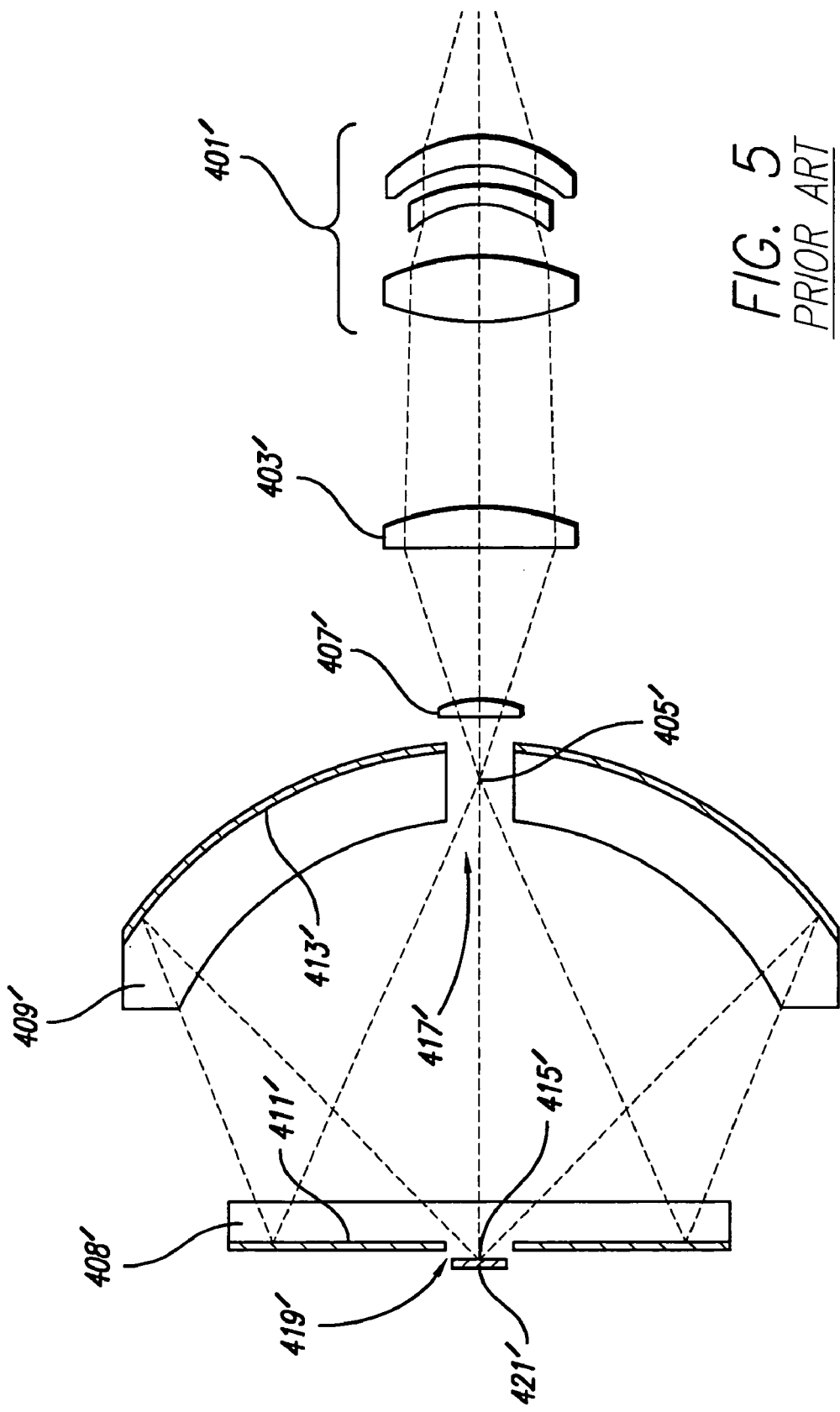
FIG. 5 presents a modified version of the catadioptric bright field imaging system of FIG. 4, optimized for use in 0.193 micron wavelength high power excimer laser applications.
Figure 6:
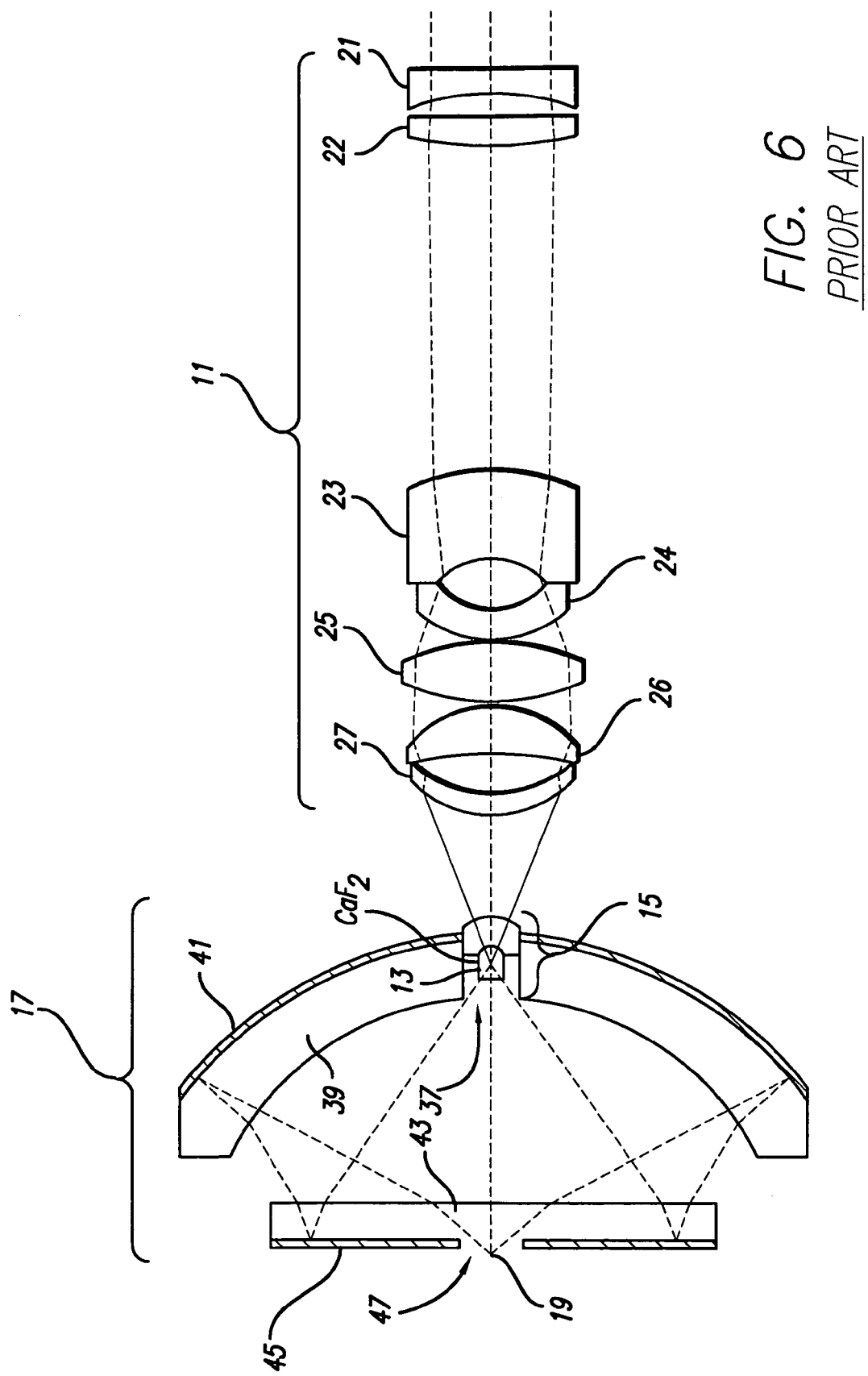
FIG. 6 illustrates a broad spectrum ultraviolet catadioptric imaging system.
Figure 14:
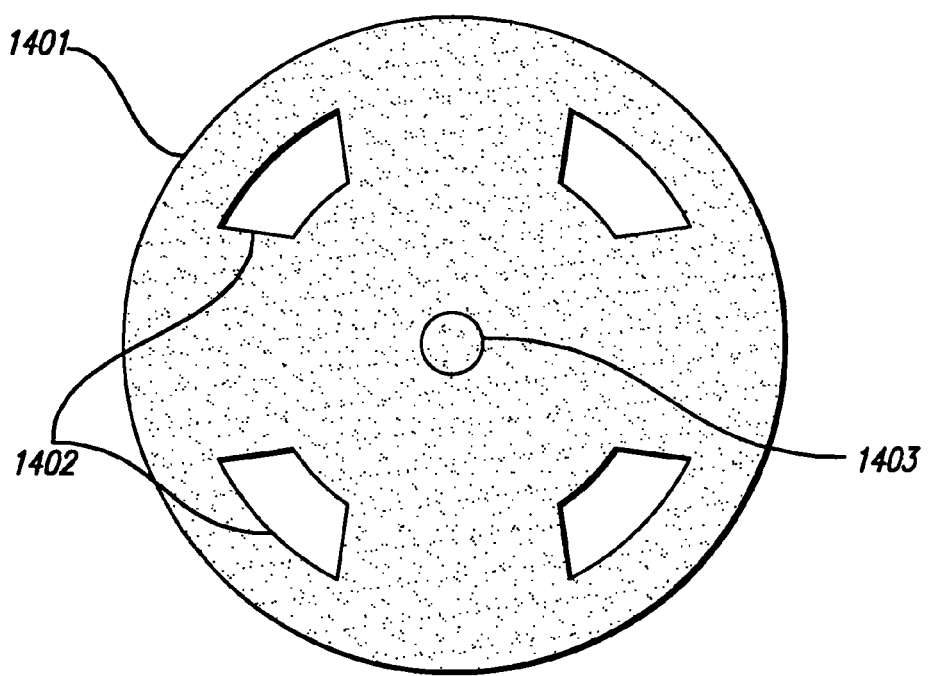
FIG. 14 illustrates an aperture which may be used with the catadioptric system when selecting the Manhattan geometry mode.

The system can also operate in the Manhattan geometry mode. This mode can use normal illumination as described in the central dark ground mode or oblique illumination as described in the directional dark field mode. The Manhattan geometry uses high angle light collection from four different quadrants. An aperture that provides this type of collection may be as shown in FIG. 14. FIG. 14 is a filter 1401 having four apertures 1402 for capturing high angle scattering in portions of the four separate quadrants. Such a filter may be used in connection with a system as shown in FIGS. 3a and 3b.

Additionally, the inventive system disclosed herein can operate in the bright field confocal imaging mode. This mode takes advantage of the short depth-of-focus obtainable by using a high NA objective and short wavelength illumination. Bright field confocal mode illuminates the object with a single point or a line focus. The illumination spot on the object is then imaged through an aperture in front of a detector. This aperture and detector can be a pinhole and a single point detector, in the case of a single point focus, or a slit and a linear detector array, in the case of a line focus. The object, illumination spot, aperture, or a combination thereof are then scanned to collect information about an area on the object being examined.

Additionally, the system can operate in the dark field confocal imaging mode. The dark field confocal imaging mode also takes advantage of the short depth-of-focus obtainable by using a high NA objective and short wavelength illumination. This is a unique imaging mode is made possible by the high NA diffraction limited illumination. High NA ring illumination produces a diffraction limited spot or line and the remaining NA can support diffraction limited imaging. For example, the illumination can occupy a ring from 0.9 to 0.97 NA and the NA up to 0.9 can be used for imaging. The illumination spot on the object is imaged, using an NA that is less than the illumination NA, through an aperture in front of a detector. This aperture and detector can be a pinhole and a single point detector, in the case of a single point focus, or a slit and a linear detector array, in the case of a line focus. The object, illumination spot, aperture, or a combination thereof are then scanned to collect information about an area on the object being examined.

The system can alternately operate in the conoscopic mode. In this mode oblique illumination is used as described above in the section on directional dark field or normal illumination can be used as described in relation to central dark ground mode. In this mode lenses are not required to form an image on a detector. The light at the pupil plane or in the collimated range of the objective can be placed directly on a single detector, multiple detectors, or a detector array. Any aperture that limiting the range of angles reaching the detector can also be used at the pupil plane or in the collimated range prior to the detector. The portions of the pupil plane that are most sensitive to the features of interest can be selected for detection. This signal is then be compared to other similar signals form similar objects to detect changes in the features on the object.

As may be appreciated from the previous paragraphs, the inventive concept disclosed herein is that multiple imaging modes can be implemented using a single optical system or machine. The ultra high NA disclosed for illumination and collection permits the implementation of imaging modes using the same optical system, thereby allowing optimization of imaging for different types of defects or samples. Illumination angles from 0 to 85 degrees can be easily implemented, thereby allowing maximum flexibility when choosing an illumination angle. Collection angles from 0 to 82 degrees are possible.

Further, it should be noted that oblique dark field illumination through the dome-shaped reflector in the modes disclosed herein does not interfere with image pupil filtering. This dark field illumination can be achieved through an aperture in the mirror coating with the entrance angle being the same angle striking the object. This feature permits the illumination and imaging pupils to be separate from one another, and thus the illumination and imaging pupil do not interfere with one another. The unique oblique illumination scheme used in the different dark field modes renders the catadioptric system disclosed herein much more flexible with respect to desired illumination schemes and aperturing and filtering techniques.

FIGS. 11, 12, and 14 are some examples of different pupil apertures that may be used to select different imaging modes. As with all mode selection apertures illustrated, these may be fabricated from a section of clear glass with appropriate portions, such as annular block 1103, 1203, or 1403 screened out using an opaque material, such as paint or other non-transparent material. Other means of forming such filters, such as using metal or composite material, may be used while still within the scope of the current invention.

A liquid crystal device, micro-mirror array, or some other addressable array device can be used to segment the pupil. For example, a liquid crystal array can be placed at the pupil plane. Portions of the array can be made opaque and other portions transparent to correspond to the desired pupil aperture, such as those in FIGS. 11, 12, and 14.

The dimensions for the system illustrated in FIG. 7 are as follows, where the surface numbers 0 through 26 track the surfaces and gaps the light passes through and reflects off in performing the different imaging modes:

This is an all fused silica design with a 0.97 NA, 1.0 mm field size, and a 15.46 mm focal length. This design is for use at a wavelength of 0.266 micrometers where the index of fused silica is 1.499776.

| Surface [element] | Radius (mm) | Thickness (mm) | Aperture Radius (mm) | Material |
|---|---|---|---|---|
| 0 | — | 1.0917e+20 | 3.5297e+18 | Air |
| 1 [716] | −33.497056 | 5.689687 | 18.000000 | Fused Silica |
| 2 [716] | −32.189281 | 0.100000 | 19.000000 | Air |
| 3 [715] | 196.880765 | 4.000000 | 19.000000 | Fused Silica |
| 4 [715] | 25.684572 | 6.560210 | 17.000000 | Air |
| 5 [714] | 357.899464 | 5.000000 | 19.000000 | Fused Silica |
| 6 [714] | −90.078811 | 0.100000 | 19.000000 | Air |
| 7 [713] | 24.037819 | 12.750000 | 20.500000 | Fused Silica |
| 8 [713] | 432.836029 | 5.920196 | 20.500000 | Air |
| 9 [712] | −40.013173 | 3.250000 | 19.500000 | Fused Silica |
| 10 [712] | — | — | 20.500000 | Air |
| 11 [708] | — | — | 35.000000 | Aperture stop |
| 12 | — | 10.624120 | 35.000000 | Air |
| 13 [711] | 26.394355 | 20.000000 | 17.500000 | Fused Silica |
| 14 [711] | 19.724315 | 4.038458 | 12.000000 | Air |
| 15 [710] | 128.412673 | 9.508548 | 12.500000 | Fused Silica |
| 16 [710] | −24.741473 | 0.100000 | 12.500000 | Air |
| 17 [709] | 21.128369 | 4.000000 | 9.5000000 | Fused Silica |
| 18 [709] | −155.179382 | 10.50000 | 9.5000000 | Air |
| 19 [706] | — | 47.457785 | 0.122526 | Air |
| 20 [705] | — | 14.508002 | 58.000000 | Fused Silica |
| 21 [705] | — | −14.508002 | 58.000000 | Reflective |
| 22 [705] | — | −47.457785 | 58.000000 | Air |
| 23 [706] | 75.786086 | 47.457785 | 64.000000 | Reflective |
| 24 [705] | — | 14.508002 | 58.000000 | Fused Silica |
| 25 [705] | — | 0.5000000 | 58.000000 | Air |
| 26 | — | 0.500543 | | |

Surface 26 represents the gap distance between near flat reflector 705 and object 704. Note that surface 11 represents the aperture allowing light to pass from surface 10 on element 712, and surface 12 represents the size of the air gap between within focusing group 702.

Figure 15:
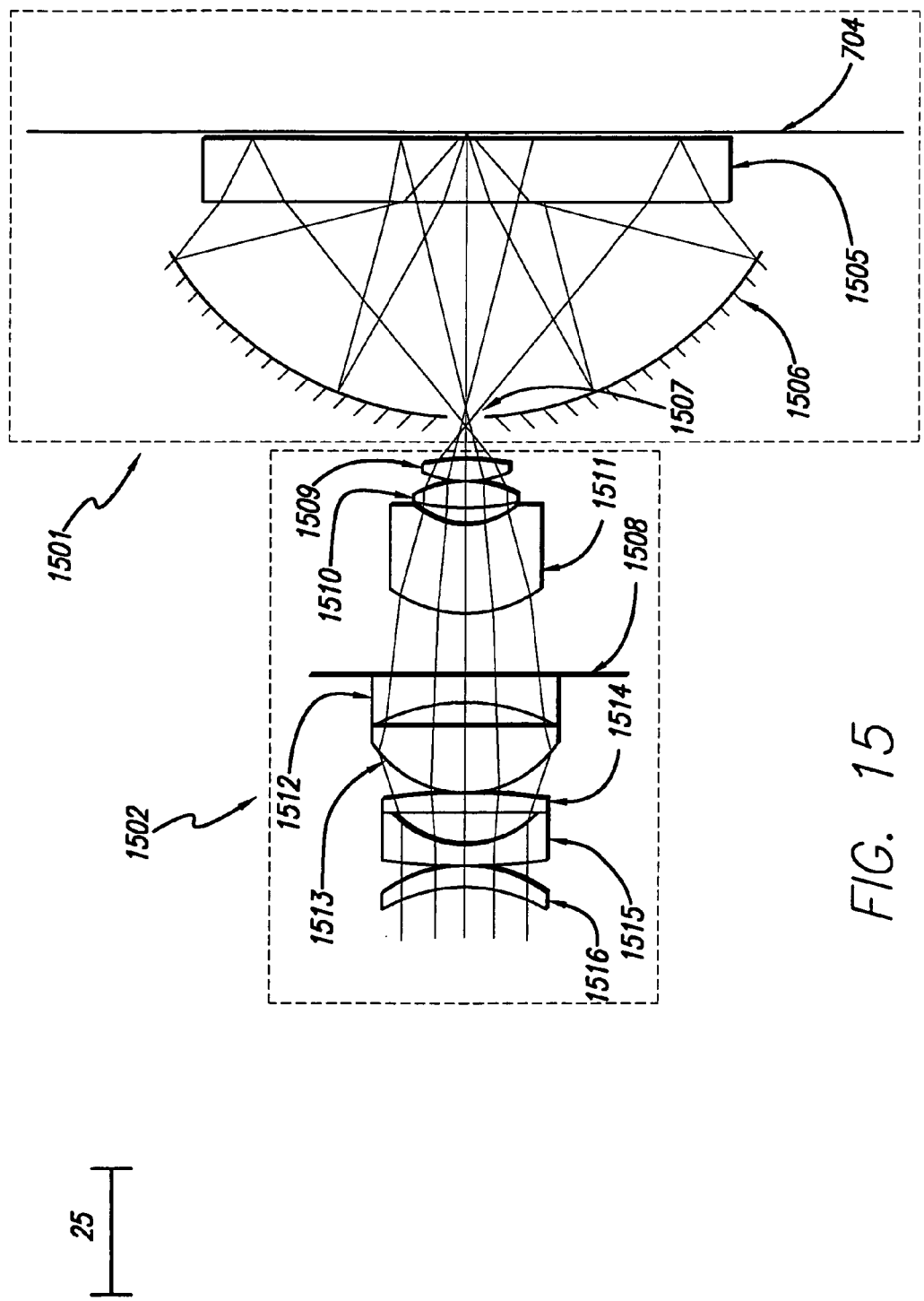
FIG. 15 is a multimode catadioptric dark field imaging system in accordance. with the current invention and constructed to have a 0.98 NA.

An alternative embodiment of this system may also be designed to include higher NA values, an example of which is illustrated in FIG. 15. This embodiment of the system is optimized for use at 0.98 NA. Note that the system of FIG. 15 uses the same basic components and configuration as that shown in FIG. 7, using a 0.98 NA catadioptric group 1501 and a 0.98 NA focusing optics group 1502. As may be appreciated from the figure and the following table, the system components or surfaces are similar to the 0.97 NA system, with some slightly differing surface curvatures and spatial separations between the elements.

Dimensions for the system of FIG. 15 are as follows (with surface numbering similar to that from the table and drawing of FIG. 7):

This embodiment of the system is an all fused silica design with a 0.98 NA, 1.0 mm field size, and a 15.31 mm focal length. This design is for use at a wavelength of 0.266 micrometers where the index of fused silica is 1.499776. Intermediate image 1507 is formed in this embodiment.

| Surface [element] | Radius (mm) | Thickness (mm) | Aperture Radius (mm) | Material |
|---|---|---|---|---|
| 0 | — | 1.0917e+20 | 3.5661e+18 | Air |
| 1 [1516] | −34.690724 | 5.000000 | 18.000000 | Fused Silica |
| 2 [1516] | −32.508483 | 0.100000 | 19.000000 | Air |
| 3 [1515] | 251.168193 | 4.000000 | 19.000000 | Fused Silica |
| 4 [1515] | 25.262657 | 6.670812 | 17.250000 | Air |
| 5 [1514] | 512.120638 | 5.000000 | 19.000000 | Fused Silica |
| 6 [1514] | −85.950636 | 0.100000 | 19.000000 | Air |

-continued

| Surface [element] | Radius (mm) | Thickness (mm) | Aperture Radius (mm) | Material |
|---|---|---|---|---|
| 7 [1513] | 24.030210 | 13.002285 | 21.000000 | Fused Silica |
| 8 [1513] | 386.838892 | 6.258149 | 21.000000 | Air |
| 9 [1512] | −38.824067 | 3.250000 | 19.750000 | Fused Silica |
| 10 [1512] | — | — | 20.500000 | Air |
| 11 [1508] | — | — | 35.000000 | Aperture stop |
| 12 | — | 13.615825 | 35.000000 | Air |
| 13 [1511] | 28.596934 | 20.000000 | 18.000000 | Fused Silica |
| 14 [1511] | 20.398707 | 3.564297 | 12.500000 | Air |
| 15 [1510] | 53.168289 | 8.560685 | 13.500000 | Fused Silica |
| 16 [1510] | −25.471785 | 0.100000 | 13.500000 | Air |
| 17 [1509] | 24.150867 | 3.564297 | 10.000000 | Fused Silica |
| 18 [1509] | −265.293182 | 10.50000 | 10.000000 | Air |
| 19 [1506] | — | 47.439408 | 0.122526 | Air |
| 20 [1505] | — | 14.890298 | 60.000000 | Fused Silica |
| 21 [1505] | — | −14.890298 | 60.000000 | Reflective |
| 22 [1505] | — | −47.439408 | 60.000000 | Air |
| 23 [1506] | 75.808460 | 47.439408 | 60.000000 | Reflective |
| 24 [1505] | — | 14.890298 | 66.000000 | Fused Silica |
| 25 [1505] | — | 0.5000000 | 60.000000 | Air |
| 26 | — | 0.500549 | | |

An additional embodiment of the system is optimized for use at 0.99 NA. Note that the system of FIG. 16 uses the same basic components and configuration as that shown in FIG. 7, using a 0.99 NA catadioptric group 1601, and a 0.99 NA focusing optics group 1602. As may be appreciated from the figure and the following table, the system components or surfaces are similar to the 0.97 NA system, with some slightly differing surface curvatures and spatial separations between the elements.

Figure 16:
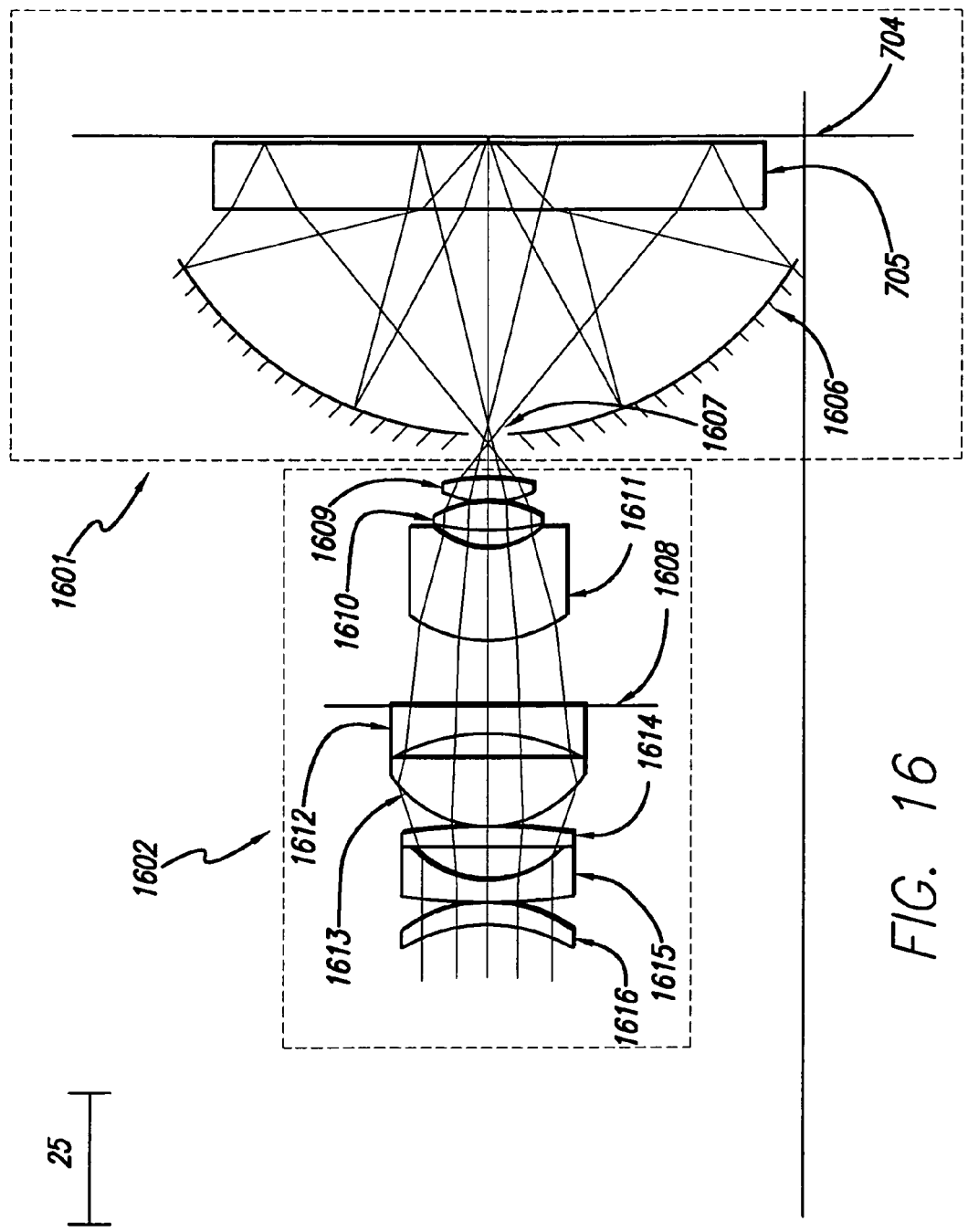
FIG. 16 is a multimode catadioptric dark field imaging system in accordance with the current invention and constructed to have a 0.99 NA.

Dimensions for the system of FIG. 16 are as follows (with surface numbering similar to that from the table and drawing of FIG. 7):

This embodiment of the system is an all fused silica design with a 0.99 NA, 1.0 mm field size, and a 15.15 mm focal length. This design is for use at a wavelength of 0.266 micrometers where the index of fused silica is 1.499776. Intermediate image 1607 is formed in this embodiment.

| Surface [element] | Radius (mm) | Thickness (mm) | Aperture Radius (mm) | Material |
|---|---|---|---|---|
| 0 | — | 1.0917e+20 | 3.6025e+18 | Air |
| 1 [1616] | −35.203096 | 5.000000 | 18.000000 | Fused Silica |
| 2 [1616] | −32.502313 | 0.100000 | 19.000000 | Air |
| 3 [1615] | 222.523869 | 4.000000 | 19.000000 | Fused Silica |
| 4 [1615] | 24.420515 | 6.583213 | 17.250000 | Air |
| 5 [1614] | 262.694007 | 5.000000 | 19.000000 | Fused Silica |
| 6 [1614] | −125.012490 | 0.100000 | 19.000000 | Air |
| 7 [1613] | 24.105961 | 13.752435 | 21.000000 | Fused Silica |
| 8 [1613] | 778.092175 | 6.309114 | 21.000000 | Air |
| 9 [1612] | −38.092856 | 3.250000 | 20.000000 | Fused Silica |
| 10 [1612] | — | — | 21.000000 | Air |
| 11 [1608] | — | — | 35.000000 | Aperture stop |
| 12 | — | 15.423856 | 35.000000 | Air |
| 13 [1611] | 34.922533 | 20.000000 | 18.500000 | Fused Silica |
| 14 [1611] | 22.960530 | 3.322518 | 13.500000 | Air |
| 15 [1610] | 50.507026 | 7.000000 | 13.750000 | Fused Silica |
| 16 [1610] | −24.636821 | 0.100000 | 13.750000 | Air |
| 17 [1609] | 24.316233 | 4.000000 | 11.000000 | Fused Silica |
| 18 [1609] | 2052.1 | 10.50000 | 11.000000 | Air |
| 19 [1606] | — | 47.541690 | 0.122526 | Air |
| 20 [705] | — | 15.730439 | 64.000000 | Fused Silica |
| 21 [705] | — | −15.730439 | 64.000000 | Reflective |
| 22 [705] | — | −47.541690 | 64.000000 | Air |
| 23 [1606] | 76.143722 | 47.541690 | 68.000000 | Reflective |
| 24 [705] | — | 15.730439 | 64.000000 | Fused Silica |
| 25 [705] | — | 0.5000000 | 64.000000 | Air |
| 26 | — | 0.500832 | | |

Yet another embodiment of the system is optimized for use at 0.97 NA with a 4 mm field of view. Note that the system of FIG. 17 uses the same basic configuration as that shown in FIG. 7, using a catadioptric group 1701 and a focusing group 1702. As may be appreciated from the figure and the following table, the system components or surfaces are similar to the previous 1 mm field size systems, with some slightly differing surface curvatures and spatial separations between the elements.

Figure 17:
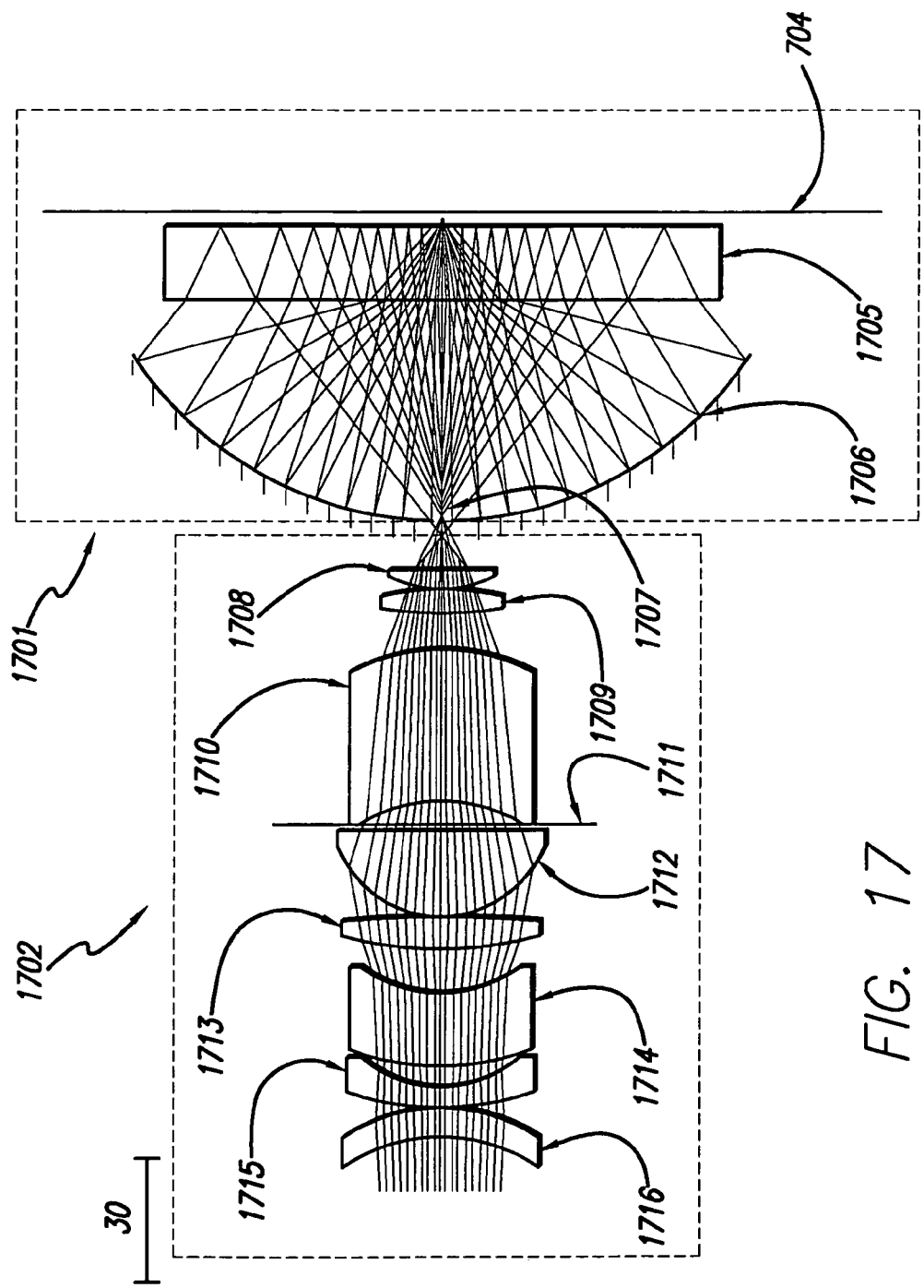
FIG. 17 is a system having increased field size, specifically approximately 4.0 millimeters.

An example of an imaging system having increased field size is illustrated in FIG. 17. As shown therein, nine lenses 1708–1717 contribute with a catadioptric group to increase field size to 4.0 mm for a 0.97 NA.

Aperture stop 1712 is located halfway through the lens arrangement. From FIG. 17, the ray spacing is unequal in the middle of the design, although the rays become equally spaced at the left side of the lens arrangement. This illustrates the one-to-one correspondence between the rays in the dome and the output plane. This ray spacing provides higher order correction capability. As the lens arrangement causes the ray spacing to be unequal on the strongly curved ninth surface (left surface on lens 1713), the rays encounter more spherical aberration on the ninth surface than normal, towards the edge of the aperture, and thereby provide the higher order spherical aberration needed to compensate for the catadioptric elements. The system illustrated in FIG. 17 has a Strehl ratio ranging from 0.50 to 0.73 over the 4.0 mm field size.

This embodiment of the system is an all fused silica design with a 0.97 NA, 4.0 mm field size, and a 17.53 mm focal length. This design is for use at a wavelength of 0.266 micrometers where the index of fused silica is 1.499776.

Dimensions for the system of FIG. 17 are as follows (with surface numbering similar to that from the table and drawing of FIG. 7):

| Surface [element] | Radius (mm) | Thickness (mm) | Aperture Radius (mm) | Material |
|---|---|---|---|---|
| 0 | — | 1.0000e+20 | 1.1429e+19 | Air |
| 1 [1716] | −49.313195 | 7.000000 | 26.000000 | Fused Silica |
| 2 [1716] | −48.825209 | 0.100000 | 26.000000 | Air |
| 3 [1715] | 75.954248 | 5.500000 | 25.000000 | Fused Silica |
| 4 [1715] | 34.364908 | 5.563965 | 21.500000 | Air |
| 5 [1714] | 80.813499 | 17.867130 | 24.000000 | Fused Silica |
| 6 [1714] | 39.762098 | 10.928315 | 21.500000 | Air |
| 7 [1713] | 102.036933 | 8.000000 | 26.000000 | Fused Silica |
| 8 [1713] | −255.018249 | 0.100000 | 26.000000 | Air |
| 9 [1712] | 29.518372 | 21.076921 | 27.000000 | Fused Silica |
| 10 [1712] | 2.8375e+03 | 1.775488 | 27.000000 | Air |
| 11 | — | 40.000000 | | |
| 12 [1711] | — | 6.140712 | 40.000000 | Air |

-continued

| Surface [element] | Radius (mm) | Thickness (mm) | Aperture Radius (mm) | Material |
|---|---|---|---|---|
| Fourier plane | | | | |
| 13 [1710] | −43.892944 | 39.000220 | 22.000000 | Fused Silica |
| 14 [1710] | −48.033761 | 8.316604 | 24.000000 | Air |
| 15 [1709] | 106.289831 | 6.000000 | 16.000000 | Fused Silica |
| 16 [1709] | −68.034207 | 0.100000 | 16.000000 | Air |
| 17 [1708] | 34.181630 | 4.500000 | 14.000000 | Fused Silica |
| 18 [1708] | −1.0338e+04 | 12.00000 | 14.000000 | Air |
| 19 [1707] | — | 55.056163 | 0.138656 | Air |
| 20 [1705] | 5.4047e+03 | 19.061584 | 67.898763 | Fused Silica |
| 21 [1705] | — | −19.061584 | 67.898763 | Reflective |
| 22 [1705] | 5.4047e+03 | −55.056163 | 67.898763 | Air |
| 23 [1706] | 89.730011 | 55.056163 | 75.820285 | Reflective |
| 24 [1705] | 5.4047e+03 | 19.061584 | 67.898763 | Fused Silica |
| 25 [1705] | — | 0.5000000 | 67.898763 | Air |
| 26 [704] | — | — | 2.005791 | |

Figure 18:
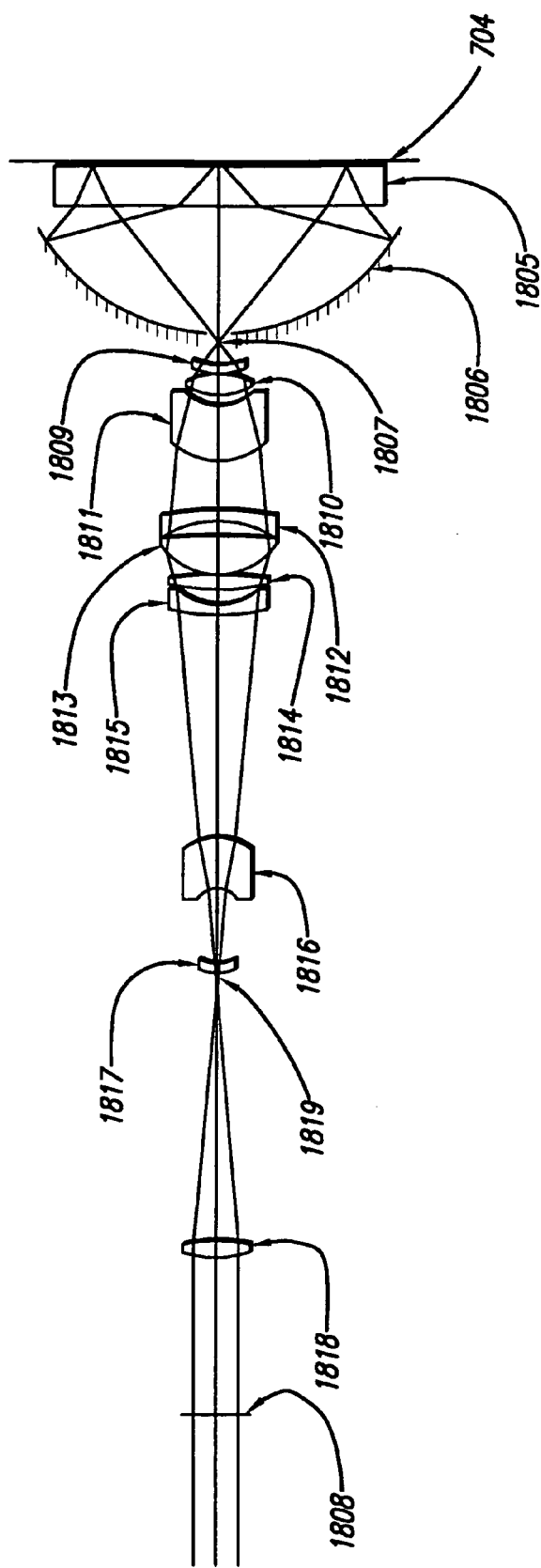
FIG. 18 presents a catadioptric system having a relayed pupil plane.

Yet a further embodiment of the current design provides an external pupil plane conjugate to the internal pupil plane of the objective as shown in FIG. 18. This pupil plane will exactly correspond to the Fourier plane of the object because it is also in the collimated range of the objective. This external pupil plane allows for improved access to the Fourier plane for filtering and aperturing. This makes this embodiment ideally suited for supporting the various imaging modes described previously. The pupil plane is relayed, using a series of lenses 1809–1818 to an external plane 1808. Note that the lenses 1809–1818 have different components but are similar to the lens arrangement of FIGS. 7, 15, and 16, and the design includes formation of intermediate image 1807. The greatest differences are the dimension and positions of lenses 1809, 1816, 1817, and 1818 and crossover 1819. These specific dimensions and positions are addressed below. The design has a 0.97 NA, 1.0 millimeter field diameter, and 0.5 millimeter working distance. The relayed pupil arrangement shown has a Strehl ratio greater than 0.90 and in the configuration shown a focal length of 12.37 millimeters.

The system of FIG. 18 has the following dimensions:

| Surface [element] | Radius (mm) | Thickness (mm) | Aperture Radius (mm) | Material |
|---|---|---|---|---|
| 0 | — | 1.0000e+10 | 6.4667e+08 | Air |
| 1 | — | — | 7.5000000 | Fourier Plane |
| 2 [1808] | — | 62.515852 | 7.5000000 | Air |
| 3 [1818] | 73.034166 | 5.000000 | 14.000000 | Fused Silica |
| 4 [1818] | −93.305910 | 91.324812 | 14.000000 | Air |
| 5 [1817] | 21.680281 | 4.0000000 | 8.5000000 | Fused Silica |
| 6 [1817] | 51.554023 | 43.401528 | 8.5000000 | Air |
| 7 [1816] | −10.644592 | 20.000000 | 8.5000000 | Fused Silica |
| 8 [1816] | −19.624195 | 77.871853 | 14.000000 | Air |
| 9 [1815] | 225.891254 | 4.0000000 | 18.000000 | Fused Silica |
| 10 [1815] | 28.200709 | 5.753232 | 17.500000 | Air |
| 11 [1814] | 383.158596 | 6.000000 | 19.000000 | Fused Silica |
| 12 [1814] | −82.143752 | 0.100000 | 19.000000 | Air |
| 13 [1813] | 26.7469644 | 14.000000 | 21.500000 | Fused Silica |
| 14 [1813] | −185.222466 | 5.859221 | 21.500000 | Air |
| 15 [1812] | −36.664980 | 4.000000 | 20.500000 | Fused Silica |
| 16 [1812] | −135.155561 | 20.360279 | 21.000000 | Air |
| 17 [1811] | 28.058433 | 20.000000 | 18.000000 | Fused Silica |
| 18 [1811] | 17.433830 | 4.434055 | 12.500000 | Air |
| 19 [1810] | 34.161468 | 7.500000 | 12.500000 | Fused Silica |
| 20 [1810] | −24.210328 | 0.100000 | 12.500000 | Air |
| 21 [1809] | 22.396238 | 3.500000 | 10.000000 | Fused Silica |
| 22 [1809] | 81.185257 | 11.50000 | 10.000000 | Air |
| 23 [1807] | — | 48.014929 | 0.122526 | Air |
| 24 [1805] | — | 15.264241 | 62.000000 | Fused Silica |
| 25 [1805] | — | −5.264241 | 62.000000 | Reflective |
| 5] | — | −48.014929 | 62.000000 | Air |
| 27 [1806] | 77.029248 | 48.014929 | 66.000000 | Reflective |
| 28 [1805] | — | 15.264241 | 62.000000 | Fused Silica |
| 29 [1805] | — | 0.5000000 | 62.000000 | Air |
| 30 [704] | — | — | 0.501766 | |

Figure 19:
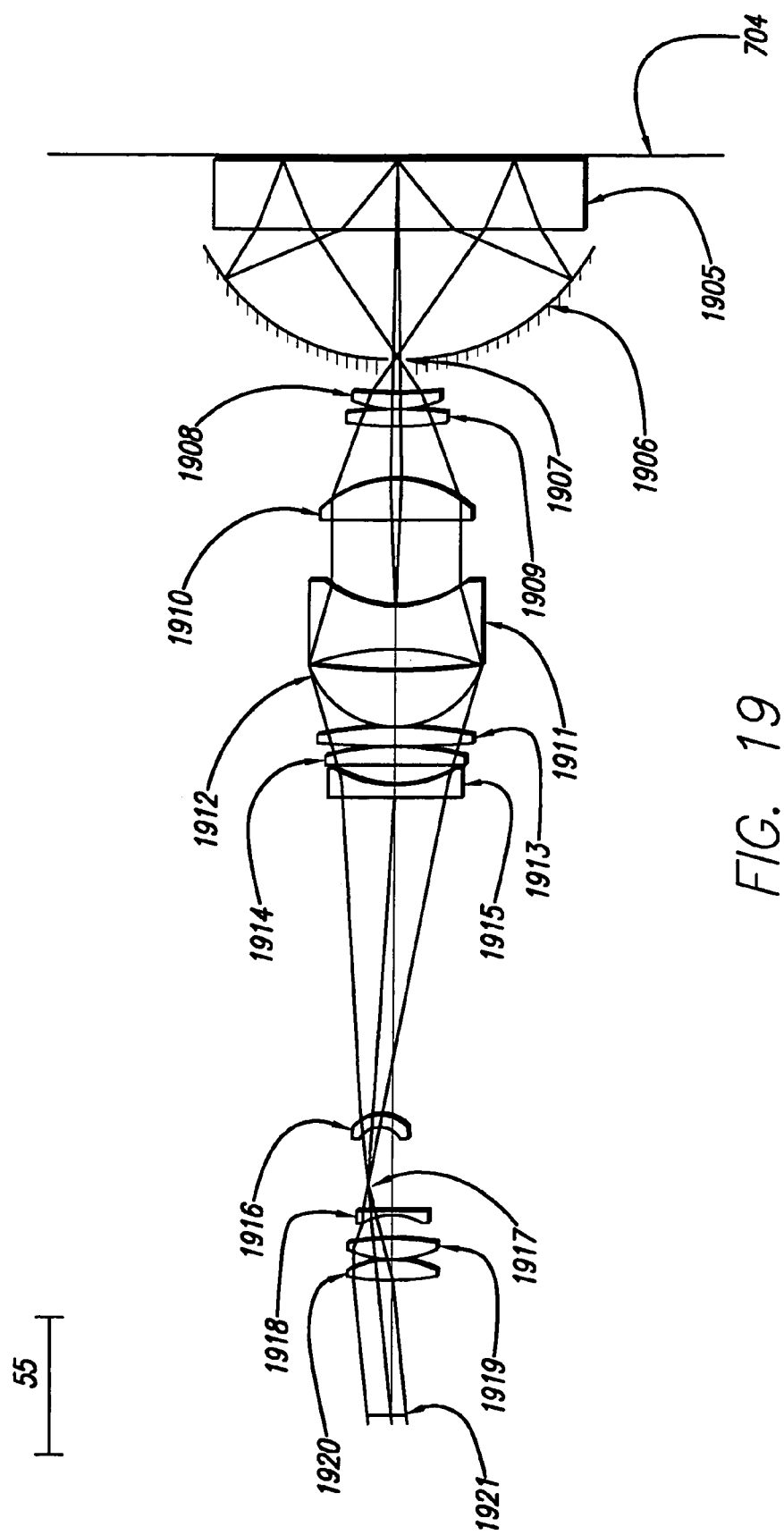
FIG. 19 presents an additional catadioptric system with a relayed pupil plane.

Still a further embodiment of the current design also provides an external pupil plane conjugate to the internal pupil of the objective as shown in FIG. 19. This design includes crossover 1917 and intermediate image 1907. This is an all fused silica design with a 0.98 NA, 2.0 mm field size, a 7.653 mm focal length, and 0.75 millimeter working distance. This design is for use at a wavelength of 0.266 micrometers where the index of fused silica is 1.499776.

The system of FIG. 19 has the following dimensions:

| Surface [element] | Radius (mm) | Thickness (mm) | Aperture Radius (mm) | Material |
|---|---|---|---|---|
| 0 | — | 1.0000e+20 | 1.3065e+19 | Air |
| 1 | — | — | 7.50000 | Fused Silica |
| 2 [1921] | — | 56.10343 | 7.50000 | Air |
| 3 [1920] | 172.92817 | 6.50000 | 17.00000 | Fused Silica |
| 4 [1920] | −51.15640 | 1.00000 | 17.00000 | Air |
| 5 [1919] | 36.69504 | 7.00000 | 17.00000 | Fused Silica |
| 6 [1919] | −101.81708 | 9.33307 | 17.00000 | Air |
| 7 [1918] | −40.11542 | 3.00000 | 13.00000 | Fused Silica |
| 8 [1918] | −131.54232 | 32.30953 | 13.00000 | Air |
| 9 [1916] | −10.54200 | 5.29845 | 8.00000 | Fused Silica |
| 10 [1916] | −13.00226 | 126.38070 | 10.00000 | Air |
| 11 [1915] | −1615.27308 | 4.50000 | 29.00000 | Fused Silica |
| 12 [1915] | 60.17164 | 7.97588 | 27.00000 | Air |
| 13 [1914] | −2.6045e+04 | 7.50000 | 30.00000 | Fused Silica |
| 14 [1914] | −107.86582 | 0.10000 | 30.00000 | Air |
| 15 [1913] | 407.32327 | 8.00000 | 33.00000 | Fused Silica |
| 16 [1913] | 31 158.71706 | 0.10000 | 33.00000 | Air |
| 17 [1912] | 41.13105 | 22.90344 | 36.50000 | Fused Silica |
| 18 [1912] | 476.74020 | 8.02351 | 36.00000 | Air |
| 19 [1911] | −108.54992 | 17.81428 | 36.00000 | Fused Silica |
| 20 [1911] | 52.28708 | 32.71346 | 30.00000 | Air |
| 21 [1910] | 744.72666 | 17.00000 | 31.00000 | Fused Silica |
| 22 [1910] | −47.71508 | 21.21160 | 31.00000 | Air |
| 23 [1909] | 112.01284 | 7.00000 | 21.00000 | Fused Silica |
| 24 [1909] | −132.26649 | 0.10000 | 21.00000 | Air |
| 25 [1908] | 46.50995 | 6.00000 | 18.00000 | Fused Silica |
| 26 [1908] | 213.25215 | 13.00000 | 18.00000 | Air |
| 27 [1906] | — | 51.58643 | 0.13054 | Air |
| 28 [1920] | — | 26.79611 | 73.00000 | Fused Silica |

-continued

| Surface [element] | Radius (mm) | Thickness (mm) | Aperture Radius (mm) | Material |
|---|---|---|---|---|
| 29 [1905] | — | −26.79611 | 73.00000 | Reflect |
| 30 [1905] | — | −51.58643 | 73.00000 | Air |
| 31 [1906] | 88.23207 | 51.58643 | 77.00000 | Reflect |
| 32 [1905] | — | 26.79611 | 73.00000 | Fused Silica |
| 33 [1905] | — | 0.75000 | 73.00000 | Air |
| 34 [704] | — | — | 1.00123 | image |

Figure 20:
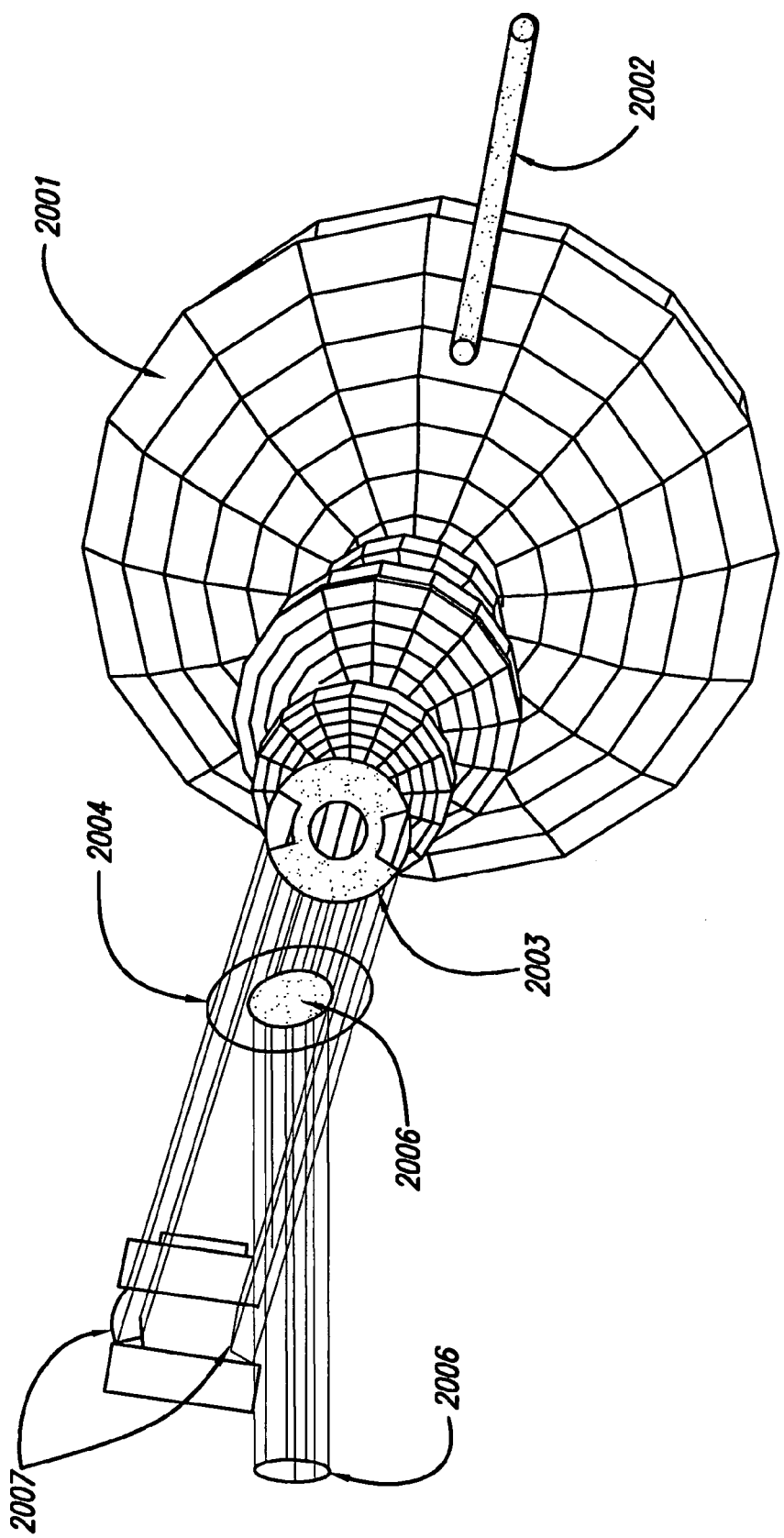
FIG. 20 illustrates the simultaneous operation of double dark field and directional dark field modes in the inventive system disclosed herein.

Transferring the pupil to an external plane affords easy simultaneous operation of various dark field schemes. For example, double dark field and directional dark field can be performed using the system illustrated in FIG. 20. The system illustrated in FIG. 20 is based on the catadioptric objective with a relayed pupil. From FIG. 20, the catadioptric system 2001 employs a laser for oblique illumination as shown by laser beam 2002. Scattered, diffracted, and reflected light collected from the object is filtered at the pupil plane by a filter 2003 similar to a composite of the filters illustrated in FIGS. 11 and 12. The light beam 2006 passing through the central opening in the pupil filter 2003 corresponds to the directional dark field scheme, while light passing through the outer openings of pupil filter 2003 corresponds to the double dark field scheme. Light energy for these two different dark field schemes may be separated using a plate 2004 having a reflective central spot 2006 and directed to separate detectors, as shown by exterior portion 2007 and interior portion 2008. Other simultaneous schemes are also possible and within the scope of the current invention, such as normal incidence dark field imaging using oblique and near normal collection.

Other methods of pupil shaping may be employed while still within the scope of the current invention. For example, pupil shaping may create simultaneous operation with different dark field schemes. A diffractive optic, segmented optic, or other device can be placed at or near the pupil plane to direct different portions of the pupil to different locations. Multiple detectors or a single scanned detector can be used.

In a further embodiment, a tube lens group can be used with the 0.97, 0.98, and 0.99 NA objectives in systems having a 1.0 mm field size. The tube lens group has the same 30 mm collimated beam diameter as used in those designs as shown in FIGS. 7, 15, 16 and 17 and is designed for the single wavelength of 0.266 micrometers. The tube lens group magnifies the 1.0 mm field size of the objectives onto a 36 mm detector. In accordance with other embodiments disclosed herein, the tube lens group is designed to have a distant exterior pupil plane to match the buried interior pupil of the catadioptric objectives. A similar tube lens group can also be designed to work with objectives that have a larger field of view or a relayed pupil. The Strehl ratio of the tube lens group design is approximately 0.99 over the field. A more complicated tube lens group design is necessary for use with the larger field size objective due not only to larger field size but also to the lower magnification if the same size detector is used.

Figure 21A:
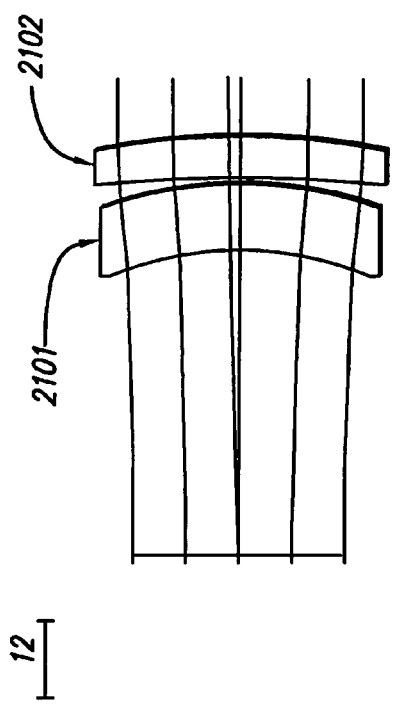
FIG. 21a shows an expanded view of the tube lens group.
Figure 21B:
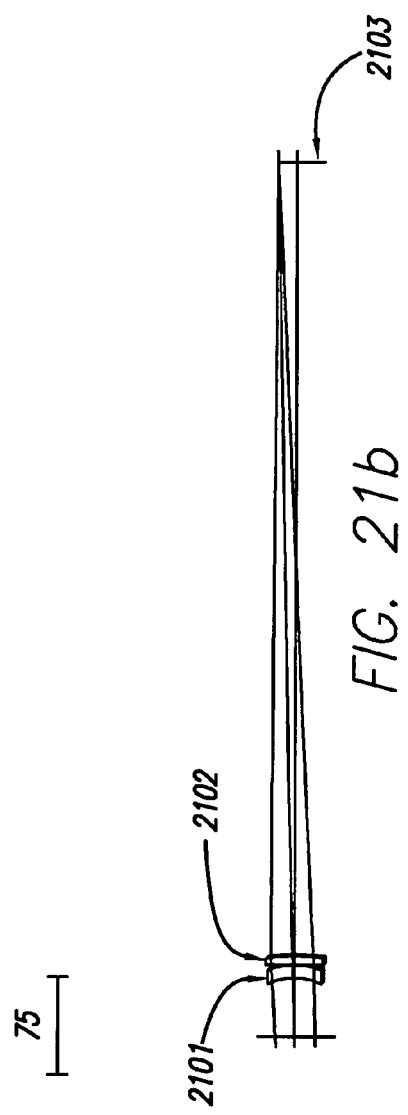
FIG. 21b presents a tube lens group for use with varying NA systems and providing mapping of a 1.0 millimeter field size image onto a 36 millimeter detector.

The tube lens group is illustrated in FIGS. 21a and 21b and includes lenses 2101 and 2102 as well as focal plane 2103. A tube lens group having focal length of 555.6 mm and an NA of 0.027 will have the following dimensions for 0.97, 0.98, and 0.99 NA objectives for a wavelength of 0.266 micrometers and a 30 mm beam diameter:

| Surface [element] | Radius (mm) | Thickness (mm) | Aperture Radius (mm) | Material |
|---|---|---|---|---|
| 0 | — | 1.0000e+20 | 3.2400e+18 | Air |
| 1 (Aperture Stop) | — | 46.090490 | 15.000000 | Air |
| 2 [2101] | −49.980600 | 10.00000 | 19.000000 | Fused Silica |
| 3 [2101] | −56.665981 | 1.000000 | 20.000000 | Air |
| 4 [2102] | −217.218335 | 6.000000 | 21.000000 | Fused Silica |
| 5 [2102] | −111.297311 | 599.512125 | 21.000000 | Air |
| 6 | — | — | 18.000054 | Air |

The resultant image is thus 36 millimeters in length.

Still another embodiment of the current system uses a six element varifocal tube lens group for 20× to 200× as shown in FIG. 22a and which can be independently corrected from the main system and which provides magnification and transposition from the pupil plane. At the edge of the 38 millimeter detector, for a 20× magnification, the Strehl ratio for a 0.266 micrometer wavelength is 0.955. This value improves over the rest of the detector and at magnifications greater than 20×. Worst case distortion from 20× to 200× is 0.06 percent. The nearest distance from a lens to the detector is 149 millimeters, and this distance increases by 777 millimeters in extending the magnification from 20× to 200×. The motion of the moving group of four lenses, as shown in FIG. 22b, is 160 mm. Note that, both FIGS. 22a and 22b illustrate the varifocal tube lens group at 20× magnification.

This varifocal tube lens group design is for use with an objective that has a 15 mm diameter pupil, such as with the relayed pupil design described above. It may also be desirable to use this type of a varifocal tube lens group with an objective that does not have a relayed pupil. This is possible using the concepts disclosed herein, with adjustments that would be apparent to those of ordinary skill in the art.

This design is for use at 0.266 micrometers where the refractive index of fused silica is 1.49968. For the 20× magnification the system has focal length of 153 mm and an NA of 0.049. The dimensions are as follows:

| Surface [element] | Radius (mm) | Thickness (mm) | Aperture Radius (mm) | Material |
|---|---|---|---|---|
| 0 | — | 1.0000e+20 | 1.2456e+19 | Air |
| 1 [2208] Fourier Plane | — | — | 7.5000000 | |
| 2 [2208] | — | 152.90980 | 7.5000000 | Air |
| 3 [2207] | −1002.31432 | 7.000000 | 30.000000 | Fused Silica |
| 4 [2207] | −140.48005 | 192.59159 | 30.000000 | Air |
| 5 [2206] | 127.96246 | 10.000000 | 38.000000 | Fused Silica |
| 6 [2206] | 1694.87685 | 423.59936 | 38.000000 | Air |
| 7 [2205] | 58.02517 | 8.0000000 | 21.000000 | Fused Silica |
| 8 [2205] | −126.99340 | 1.00992 | 21.000000 | Air |
| 9 [2204] | 34.98956 | 17.94389 | 19.000000 | Fused Silica |
| 10 [2204] | 136.51285 | 2.28230 | 14.500000 | Air |
| 11 [2203] | −132.38435 | 3.12463 | 14.000000 | Fused Silica |
| 12 [2203] | 20.90456 | 5.07104 | 10.500000 | Air |
| 13 [2202] | −25.78032 | 10.53393 | 10.500000 | Fused Silica |
| 14 [2202] | −27.58716 | 148.87138 | 11.500000 | Air |
| 15 | — | — | 19.05723 | |

What is claimed is:

1. An objective for imaging a specimen, comprising:
   focusing means having the ability to receive light energy and transmit focused light energy; and
   catadioptric means for receiving the focused light energy from the focusing means and imparting focused light energy at a numerical aperture in excess of 0.65;
   wherein the catadioptric means has the ability to receive reflected light energy and form an intermediate image outside the catadioptric means, and further wherein the focusing means receives and corrects aberrations in the intermediate image formed by the catadioptric means.

2. The objective of claim 1, wherein said catadioptric means comprises:
   a dome shaped reflective element having an inner surface; and
   a relatively flat reflector-lens positioned proximate the inner surface of the dome shaped reflective element.

3. The objective of claim 2, wherein the relatively flat reflector-lens comprises a relatively transparent element having a reflective outer surface with an opening in the reflective outer surface, the opening providing an ability to transmit light through the relatively flat reflector-lens.

4. The objective of claim 1, wherein said intermediate image is formed within the focusing means.

5. The objective of claim 1, wherein the catadioptric means imparts focused light energy at a numerical aperture in excess of 0.90.

6. The objective of claim 1, wherein the focusing means comprises a series of lenses formed from a single material type.

7. An objective comprising:
   a series of lenses constructed from a single material type and having the ability to be employed to collectively receive light energy and transmit focused light energy, said series of lenses having the ability to operate in association with a catadioptric group to focus light energy from the series of lenses and impart focused light energy at a numerical aperture in excess of 0.65;
   wherein the series of lenses further has the ability to operate in association with the catadioptric group to form an intermediate image, and further wherein the series of lenses can operate to correct aberrations in the intermediate image formed by the series of lenses in association with the catadioptric group.

8. The objective of claim 7, wherein said catadioptric group able to operate in association with the series of lenses comprises:
   a dome shaped reflective element having an inner surface; and
   a relatively flat reflector-lens positioned proximate the inner surface of the dome shaped reflective element.

9. The objective of claim 8, wherein the relatively flat reflector-lens comprises a relatively transparent element having a reflective outer surface with an opening in the reflective outer surface, the opening providing an ability to transmit light through the relatively flat reflector-lens.

10. The objective of claim 7, wherein said intermediate image is formed within the series of lenses when employed to collectively receive light energy and transmit focused light energy and operate in association with the catadioptric group.

11. The objective of claim 7, wherein the series of lenses operates in association with the catadioptric group to focus light energy from the series of lenses and impart focused light energy at a numerical aperture in excess of 0.90.

12. The objective of claim 7, wherein the series of lenses further has the ability to operate in an imaging mode and in association with a filter, said filter separating desired light components based on the imaging mode.

13. The objective of claim 7, wherein the series of lenses collectively has the ability to transmit focused light energy in the form of a beam and operate in conjunction with the catadioptric group to form a beam, and wherein central obscuration for the formed beam is approximately ten per cent of the beam diameter.

14. A method for imaging a specimen, comprising:
    forming a series of lenses from a single material type, said series of lenses when formed having the ability to be employed to collectively receive light energy and transmit focused light energy, said series of lenses when formed further having the ability to operate in association with a catadioptric group to focus light energy from the formed series of lenses and impart focused light energy at a numerical aperture in excess of 0.65;
    wherein the formed series of lenses further has the ability to operate in association with the catadioptric group to produce an intermediate image, and further wherein the formed series of lenses can operate to correct aberrations in the intermediate image produced by the series of formed lenses in association with the catadioptric group.

15. The method of claim 14, wherein said catadioptric group able to operate in association with the formed series of lenses comprises:
    a dome shaped reflective element having an inner surface; and
    a relatively flat reflector-lens positioned proximate the inner surface of the dome shaped reflective element.

16. The method of claim 15, wherein the relatively flat reflector-lens comprises a relatively transparent element having a reflective outer surface with an opening in the reflective outer surface, the opening providing an ability to transmit light through the relatively flat reflector-lens.

17. The method of claim 14, wherein said intermediate image is produced within the formed series of lenses when employed to collectively receive light energy and transmit focused light energy and operate in association with the catadioptric group.

18. The method of claim 14, wherein the formed series of lenses operates in association with the catadioptric group to focus light energy from the formed series of lenses and impart focused light energy at a numerical aperture in excess of 0.90.

19. The method of claim 14, wherein the formed series of lenses further has the ability to operate in an imaging mode and in association with a filter, said filter separating desired light components based on the imaging mode.

20. The method of claim 14, wherein the series of lenses collectively has the ability to transmit focused light energy in the form of a beam and operate in conjunction with the catadioptric group to form a beam, and wherein central obscuration for the formed beam is approximately ten per cent of the beam diameter.

* * * * *